(12) United States Patent
Hosek et al.

(10) Patent No.: US 11,251,065 B2
(45) Date of Patent: Feb. 15, 2022

(54) MATERIAL HANDLING ROBOT

(71) Applicant: Persimmon Technologies Corporation, Wakefield, MA (US)

(72) Inventors: Martin Hosek, Lowell, MA (US); Scott Wilkas, Lexington, MA (US)

(73) Assignee: Persimmon Technologies Corporation, Wakefield, MA (US)

( * ) Notice: Subject to any disclaimer, the term of this patent is extended or adjusted under 35 U.S.C. 154(b) by 147 days.

(21) Appl. No.: 16/818,408

(22) Filed: Mar. 13, 2020

(65) Prior Publication Data

US 2020/0219752 A1    Jul. 9, 2020

Related U.S. Application Data

(63) Continuation of application No. 16/104,529, filed on Aug. 17, 2018, now Pat. No. 10,629,472.

(60) Provisional application No. 62/548,064, filed on Aug. 21, 2017, provisional application No. 62/546,677, filed on Aug. 17, 2017.

(51) Int. Cl.
| | |
|---|---|
| *G06F 7/00* | (2006.01) |
| *H01L 21/687* | (2006.01) |
| *B25J 18/04* | (2006.01) |
| *B25J 15/00* | (2006.01) |
| *B25J 9/04* | (2006.01) |
| *B25J 9/10* | (2006.01) |
| *H01L 21/677* | (2006.01) |

(52) U.S. Cl.
CPC ........ *H01L 21/68707* (2013.01); *B25J 9/043* (2013.01); *B25J 9/104* (2013.01); *B25J 15/0052* (2013.01); *B25J 18/04* (2013.01); *H01L 21/67742* (2013.01)

(58) Field of Classification Search
CPC .......... H01L 21/68707; H01L 21/67742; B25J 9/104; B25J 18/04; B25J 15/0052; B25J 9/043
USPC ................................ 700/213–214, 228, 245
See application file for complete search history.

(56) References Cited

U.S. PATENT DOCUMENTS

| | | | |
|---|---|---|---|
| 5,513,946 A | 5/1996 | Sawada | |
| 5,587,637 A | 12/1996 | Ohyama | |
| 5,765,444 A * | 6/1998 | Bacchi | ..................... B25J 9/042 |
| | | | 414/744.5 |

(Continued)

FOREIGN PATENT DOCUMENTS

| | | |
|---|---|---|
| WO | WO-2010/080983 A2 | 7/2010 |
| WO | WO-2016127160 A1 | 8/2016 |

*Primary Examiner* — Yolanda R Cumbess
(74) *Attorney, Agent, or Firm* — Harrington & Smith

(57) ABSTRACT

An apparatus including a controller; a robot drive; a robot arm connected to the robot drive, where the robot arm has links including an upper arm, a first forearm connected to a first end of the upper arm, a second forearm connected to a second opposite end of the upper arm, a first end effector connected to the first forearm and a second end effector connected to the second forearm; and a transmission connecting the robot drive to the first and second forearms and the first and second end effectors. The transmission is configured to rotate the first and second forearms relative to the upper arm and rotate the first and second end effectors on their respective first and second forearms. The upper arm is substantially rigid and movement of the upper arm by the robot drive moves both the first and second forearms in opposite directions.

16 Claims, 28 Drawing Sheets

(56) References Cited

U.S. PATENT DOCUMENTS

| | | |
|---|---|---|
| 6,547,510 B1 | 4/2003 | Beaulieu |
| 6,643,563 B2 | 11/2003 | Hosek et al. |
| 6,960,057 B1* | 11/2005 | Hofmeister ............... B25J 9/06 |
| | | 414/744.5 |
| 9,149,936 B2 | 10/2015 | Hosek et al. |
| 10,065,311 B1 | 9/2018 | Buschmann |
| 2001/0033788 A1 | 10/2001 | Pietrantonio |
| 2003/0223853 A1 | 12/2003 | Caveney et al. |
| 2005/0067995 A1 | 3/2005 | Weinhofer et al. |
| 2007/0240971 A1* | 10/2007 | Kitazumi ............... B65G 15/14 |
| | | 198/817 |
| 2010/0135752 A1 | 6/2010 | Imai |
| 2014/0090507 A1* | 4/2014 | Imai ....................... B25J 9/042 |
| | | 74/490.05 |
| 2014/0150592 A1 | 6/2014 | Kremerman |
| 2014/0205416 A1 | 7/2014 | Hosek et al. |
| 2015/0352729 A1 | 12/2015 | Hosek et al. |
| 2016/0064263 A1 | 3/2016 | Hosek et al. |
| 2016/0167229 A1 | 6/2016 | Hosek |
| 2017/0028546 A1 | 2/2017 | Wilkas et al. |
| 2017/0315517 A1 | 11/2017 | Da Silva et al. |
| 2018/0360550 A1 | 12/2018 | Nakanishi |

\* cited by examiner

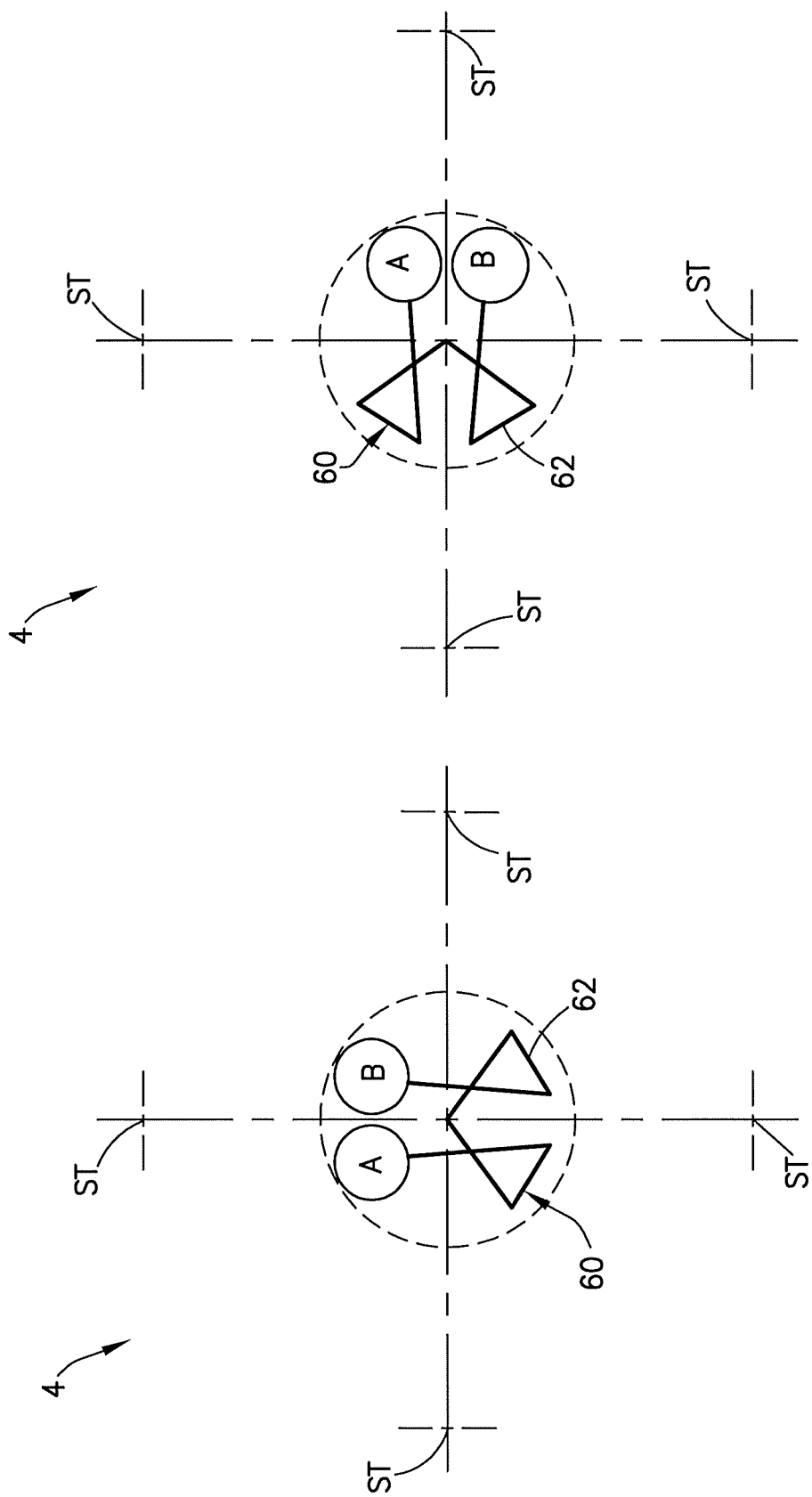

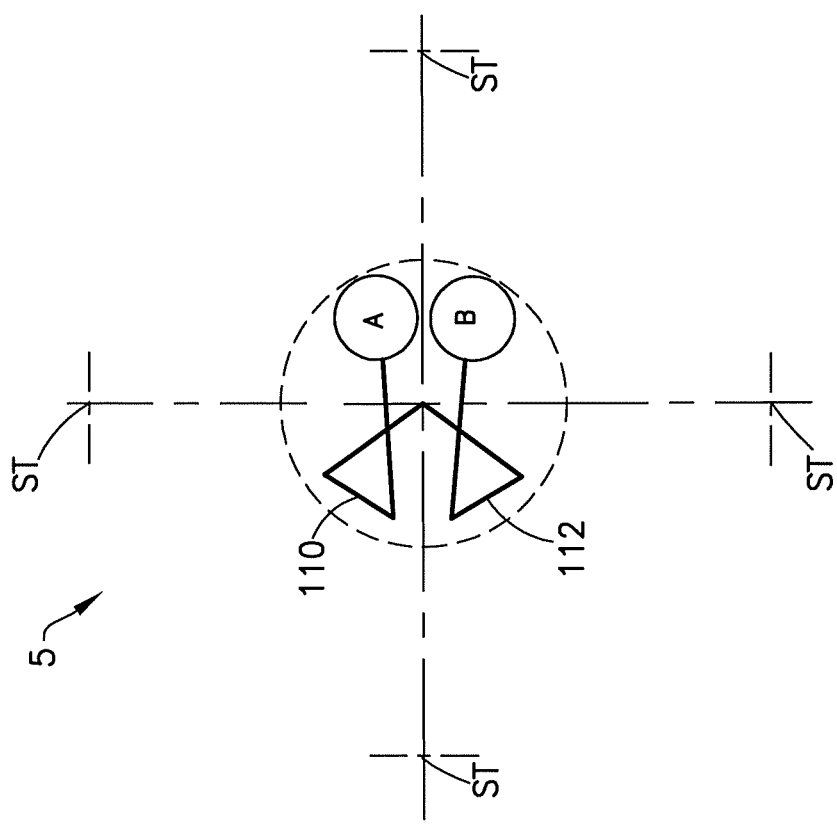
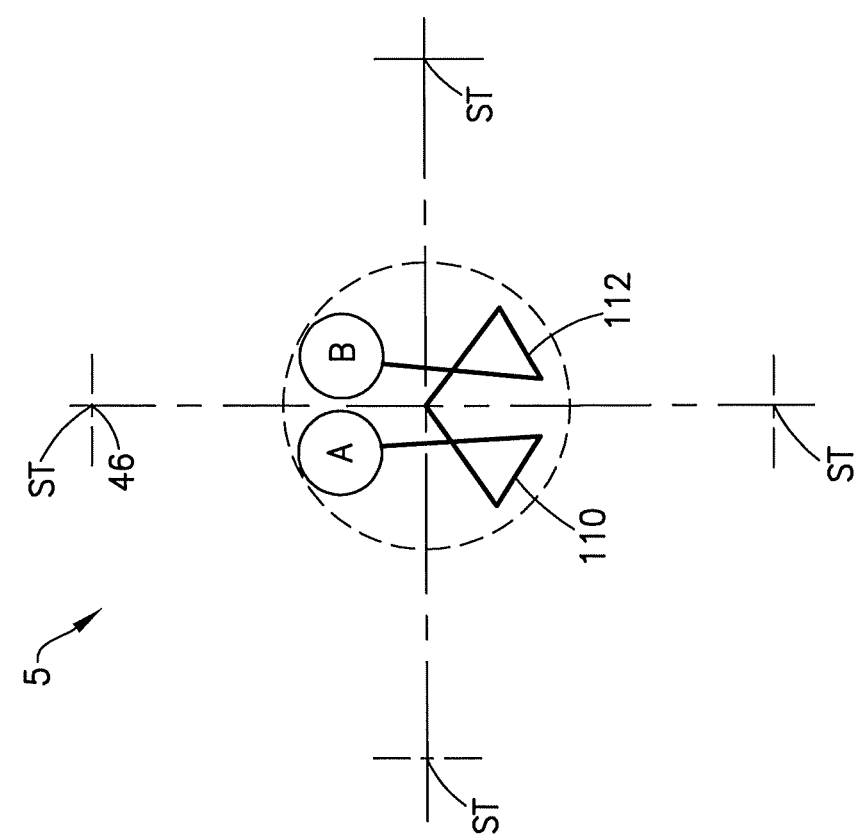

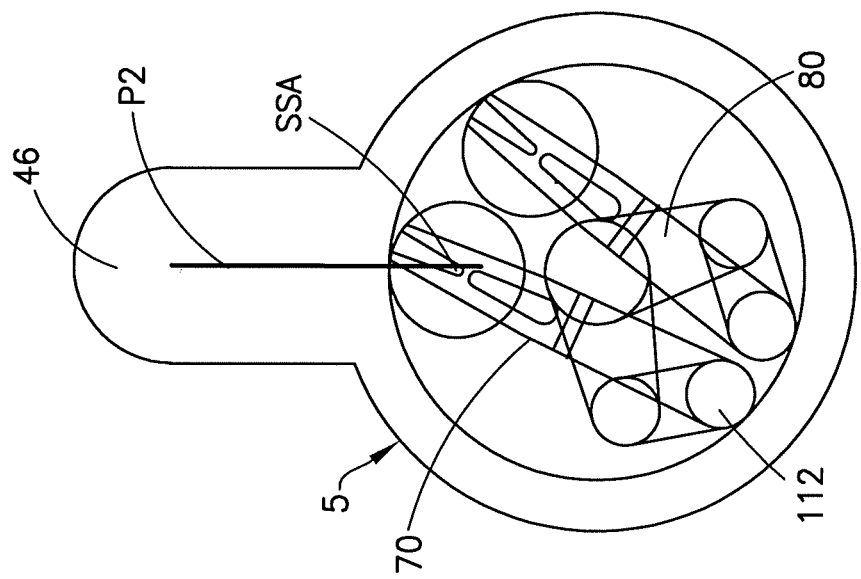
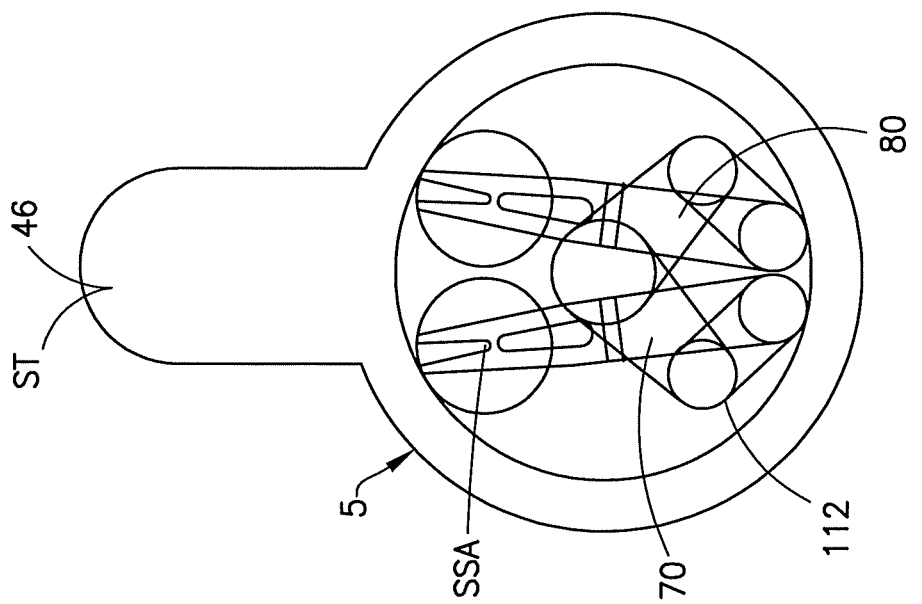

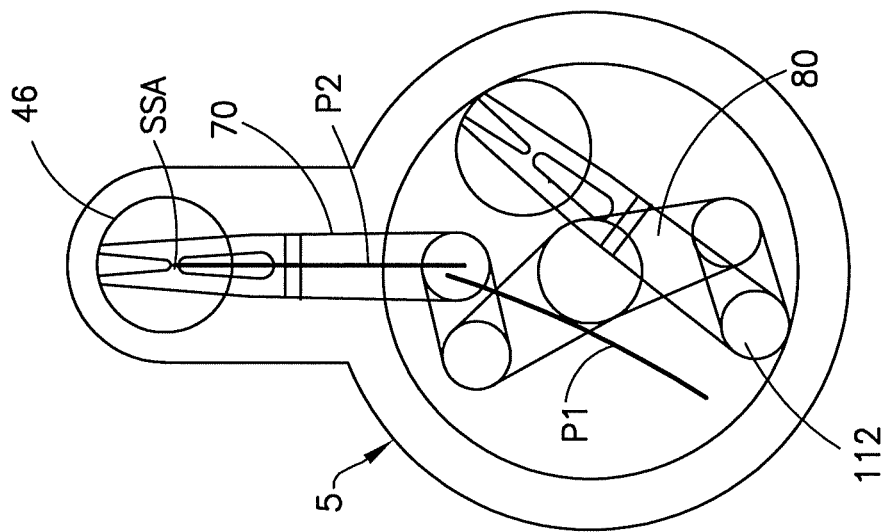
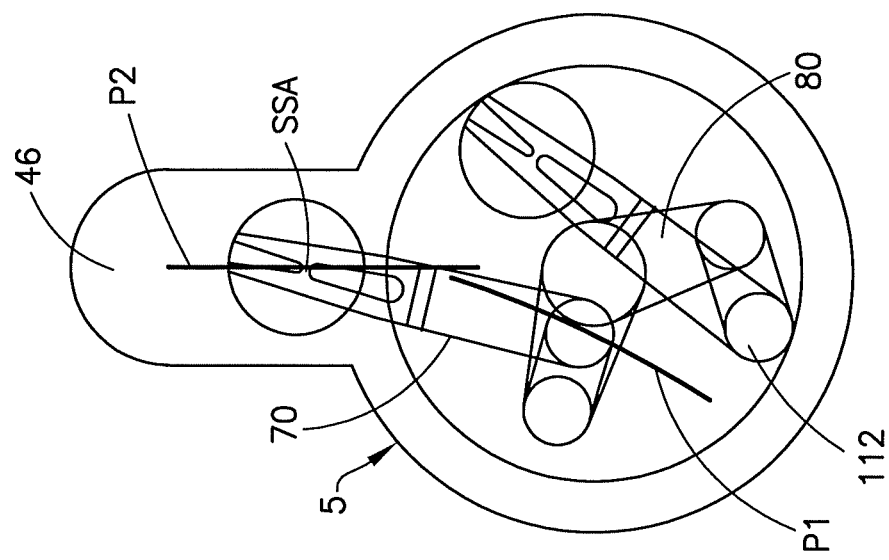

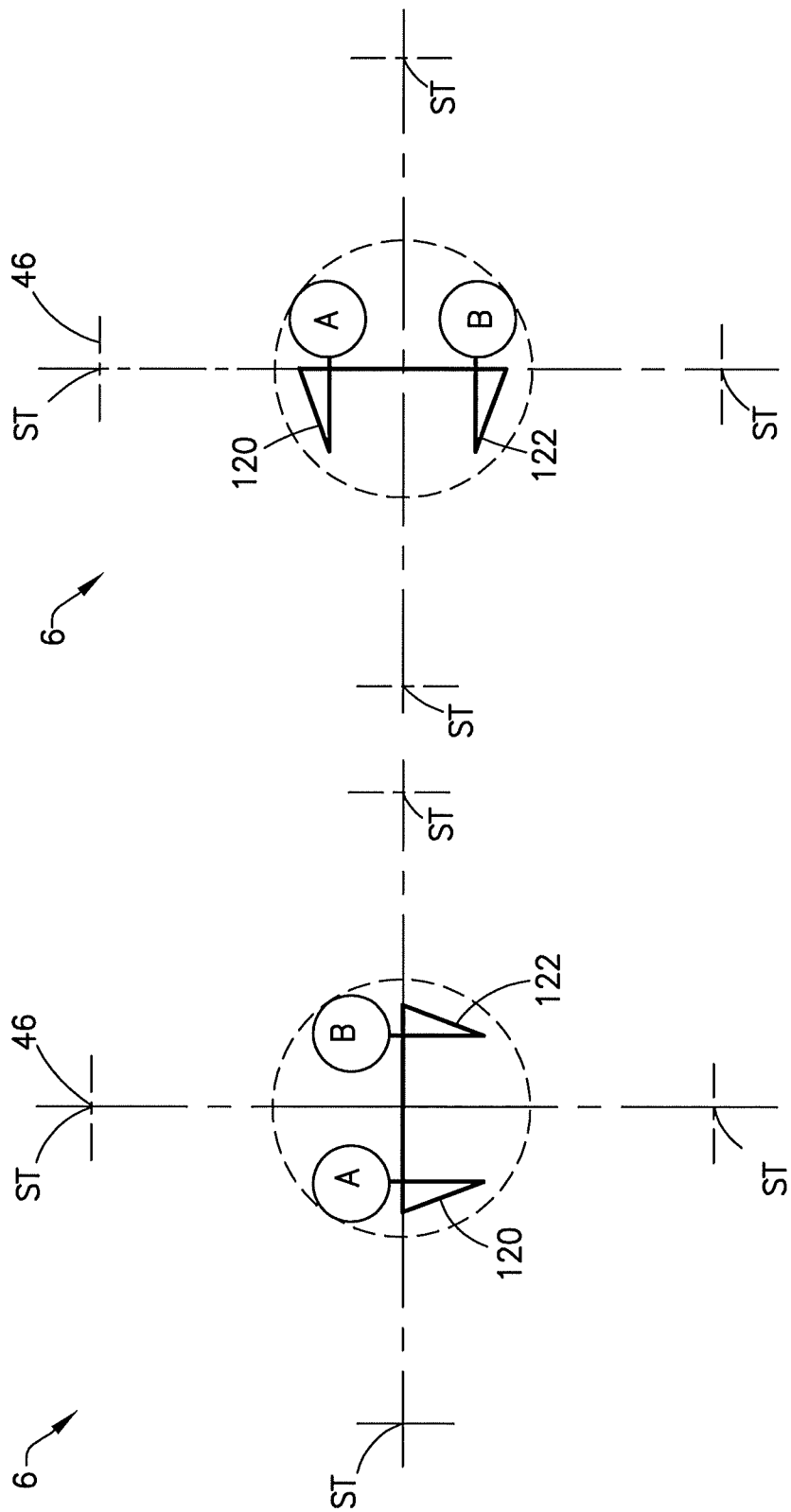

MATERIAL HANDLING ROBOT

CROSS-REFERENCE TO RELATED APPLICATIONS

This application is a continuation of copending application Ser. No. 16/104,529 filed Aug. 17, 2018, which claims priority under 35 USC 119(e) to provisional patent application No. 62/548,064 filed Aug. 21, 2017, and provisional patent application No. 62/546,677 filed Aug. 17, 2017 which are hereby incorporated by reference in their entireties.

BACKGROUND

Technical Field

The exemplary and non-limiting embodiments relate generally to a material-handling robot and, more particularly, to a material-handling robot with multiple end-effectors suitable such as for applications in semiconductor wafer processing systems.

Brief Description of Prior Developments

Material-handling robots, such as for applications in semiconductor wafer processing systems for example, are known. Some examples may be found in the following U.S. patents and patent publications (which are hereby incorporated by reference in their entireties): U.S. Pat. No. 9,149,936 which discloses how non-circular pulleys may be calculated; U.S. Patent Publication No. US 2016/0167229 A1; and U.S. Patent Publication No. US 2017/0028546 A1.

SUMMARY

The following summary is merely intended to be exemplary. The summary is not intended to limit the scope of the claims.

In accordance with one aspect, an example embodiment is provided in an apparatus comprising a controller comprising a processor and a memory comprising computer code; a robot drive coupled to the controller, where the controller is configured to control actuation of the robot drive; a robot arm connected to the robot drive, where the robot arm comprises links including an upper arm, a first forearm connected to a first end of the upper arm, a second forearm connected to a second opposite end of the upper arm, a first end effector connected to the first forearm and a second end effector connected to the second forearm; and a transmission connecting the robot drive to the first and second forearms and the first and second end effectors, where the transmission is configured to rotate the first and second forearms relative to the upper arm and rotate the first and second end effectors on their respective first and second forearms, where the upper arm is substantially rigid such that movement of the upper arm by the robot drive moves both the first and second forearms in opposite directions, where the controller and the transmission are configured to coordinate movement and rotation of the links relative to one another to move the end effectors into and out of a station comprising: moving the first forearm relative to the upper arm, while the upper arm remains substantially stationary, to move the first end effector into an entrance path of the station, and subsequently rotating the upper arm and the first forearm to move the first end effector along the entrance path in a substantially straight line into the station.

In accordance with another aspect, an example method may comprise connecting a controller to a robot drive; connecting an upper arm to a first drive shaft of the robot drive; connecting a first forearm to an end of an upper arm; connecting a second forearm to an opposite end of the upper arm; connecting a first end effector to the first forearm; connecting a second end effector to the second forearm; connecting a first transmission belt arrangement between a second drive shaft of the robot drive and the first forearm; connecting a second transmission belt arrangement between the first forearm and the first end effector, where the second transmission belt arrangement is configured to rotate the first end effector relative to the first forearm when the first forearm is rotated relative to the upper arm, where the controller and the transmission belt arrangements are configured to coordinate movement of the upper arm and the first forearm on the upper arm relative to each another to move the first end effector into a station comprising: a first path comprising moving the first forearm relative to the upper arm, while the upper arm remains substantially stationary, to move the first end effector into a starting location of a second entrance path for the station, and the second entrance path comprising subsequently rotating the upper arm and the first forearm on the upper arm to move the first end effector along the second entrance path in a substantially straight line into the station.

In accordance with another aspect, an example method may comprise moving a first end effector along a first path from a first location to a second location, where the second location is a start of a subsequent second substantially straight entrance path into a substrate processing module, where the first end effector is connected to an end of a first forearm of a robot arm, where the first end effector is moved along the first path by rotating the first forearm on an upper arm of the robot arm by a robot drive while the upper arm remains substantially stationary, and rotating the first end effector relative to the first forearm as the first forearm is rotated on the upper arm, where the robot arm comprises a transmission belt arrangement connected between the first end effector and the first forearm to automatically mechanically rotate the first end effector relative to the first forearm as the first forearm is rotated on the upper arm; and moving the first end effector from the second location into the substrate processing module along the second substantially straight entrance path, where the second substantially straight entrance path is maintained by rotating the upper arm by the robot drive to move the first forearm towards the substrate processing module and simultaneously rotating the first forearm on the upper arm while the transmission belt arrangement automatically mechanically rotates the first end effector relative to the first forearm, as the first forearm is rotated on the upper arm, to maintain the first end effector in a substantially straight line into the substrate processing module.

BRIEF DESCRIPTION OF THE DRAWINGS

The foregoing aspects and other features are explained in the following description, taken in connection with the accompanying drawings, wherein:

FIGS. 11A-11B are diagrams illustrating example movement of the robot of FIGS. 9-10 in a substrate processing system;

FIGS. 15A-15B are diagrams illustrating example movement of the robot of FIGS. 13-14 in a substrate processing system;

FIGS. 17A-17D are diagrams illustrating example movement of the robot of FIGS. 13-14 in the substrate processing system shown in FIGS. 15A-15B;

FIGS. 20A-20B are diagrams illustrating example movement of the robot of FIGS. 18-19 in a substrate processing system;

DETAILED DESCRIPTION OF EMBODIMENTS

Figure 1A:
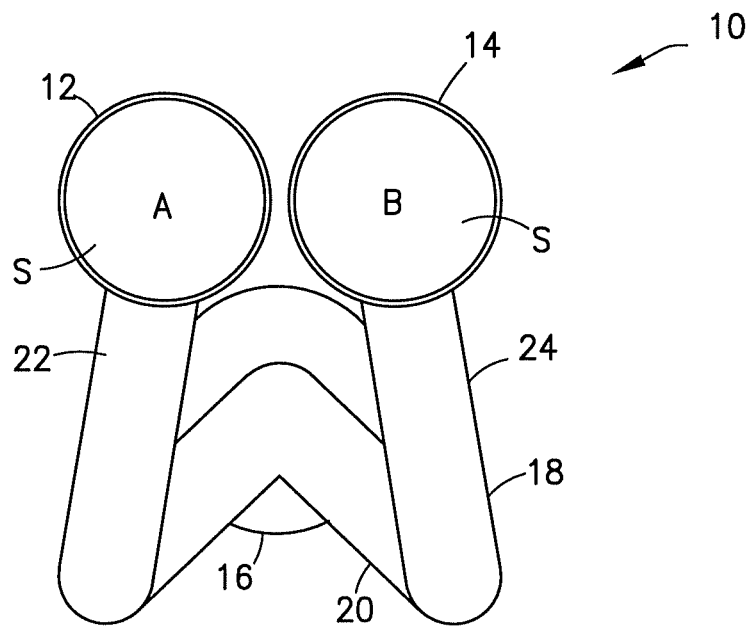
FIG. 1A is a top view of an example embodiment of a robot.
Figure 1B:
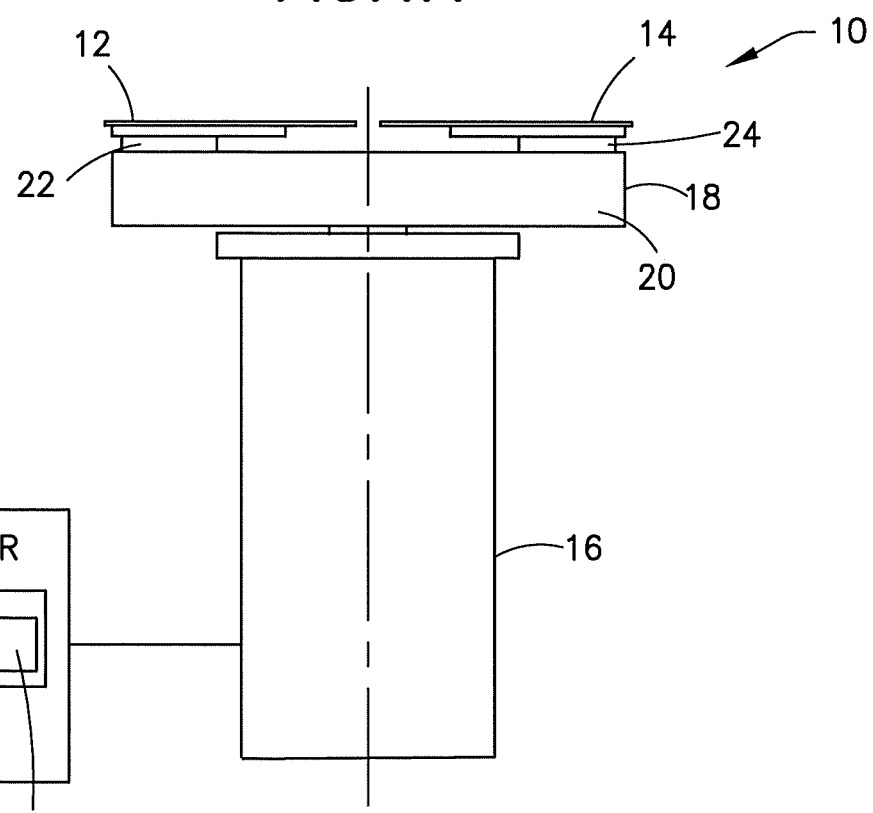
FIG. 1B is a side view of the robot shown in FIG. 1A.

Referring to FIGS. 1A-1B, an example embodiment of a robot 10 comprising features as described herein is shown. The robot 10 in this example comprises two end-effectors 12, 14 configured to support substrates S thereon. In the various figures, the left end effector is shown with the indicator "A" and the right end effector is shown with the indicator "B". FIG. 1A shows a top view of the robot 10 and FIG. 1B depicts a side view of the robot 10. The robot 10 comprises of a robot drive unit 16 and a robot arm 18. The drive unit 16 is coupled to a controller 19 which may comprise, for example, at least one processor 21 and at least one memory 23 comprising computer code 25 for controlling the drive 16 and receiving sensor signals from sensors in the drive 16 as well as other sensors and inputs (not shown). Although features will be described with reference to the example embodiments shown in the drawings, it should be understood that features can be embodied in many alternate forms of embodiments. In addition, any suitable size, shape or type of elements or materials could be used.

Figure 2:
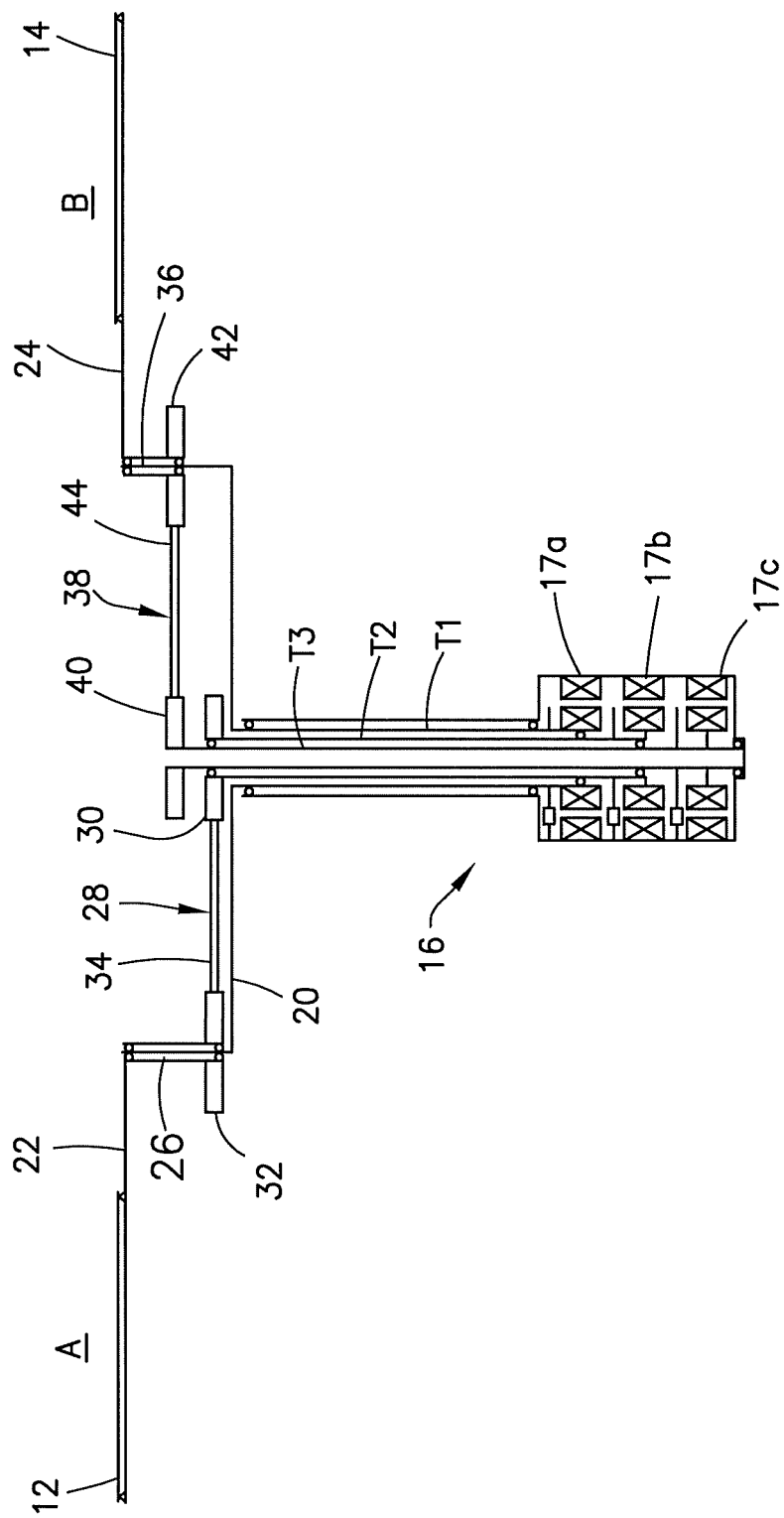
FIG. 2 is a diagram illustrating drive and transmission connections in the robot shown in FIGS. 1A-1B.

The robot arm 18 comprises an upper arm 20, a left forearm 22 with the left end-effector 12 and a right forearm 24 with the right end-effector 14. Referring also to FIG. 2, the robot arm may be driven by the robot drive unit 16. In this example embodiment, the robot drive unit 16 comprises a three-axis spindle with three coaxial shafts; an outer T1 shaft, a middle T2 shaft and an inner T3 shaft. The robot drive unit 16 comprises three motors 17a, 17b, 17c for axially rotating the drive shafts T1, T2, T3.

The upper arm 20 of the robot arm 18 may be attached directly to the T1 shaft. The left forearm 22 may be coupled to the upper arm 20 via a rotary joint (elbow joint 26), and actuated by the T2 shaft using a belt arrangement 28. The belt arrangement 28 may comprise a shoulder pulley 30, which may be attached to the T2 shaft, elbow pulley 32, which may be attached to the left forearm 22, and a band, belt or cable 34, which may transmit motion between the two pulleys 30, 32. The belt arrangement may feature a constant or variable transmission ratio. As an example, a variable transmission ratio may be implemented using non-circular pulleys.

Similarly, the right forearm 24 may be coupled to the upper arm 20 via a rotary joint (elbow joint 36), and its orientation may be controlled by the T3 shaft using another band, belt or cable arrangement 38. The belt arrangement 38 may comprise a shoulder pulley 40, which may be attached to the T3 shaft, an elbow pulley 42, which may be attached to the right forearm 24, and a band, belt or cable 44, which may transmit motion between the two pulleys 40, 42. Again, the belt arrangement 38 may feature a constant or variable transmission ratio, for example, implemented through the use of non-circular pulleys.

Figure 3B:
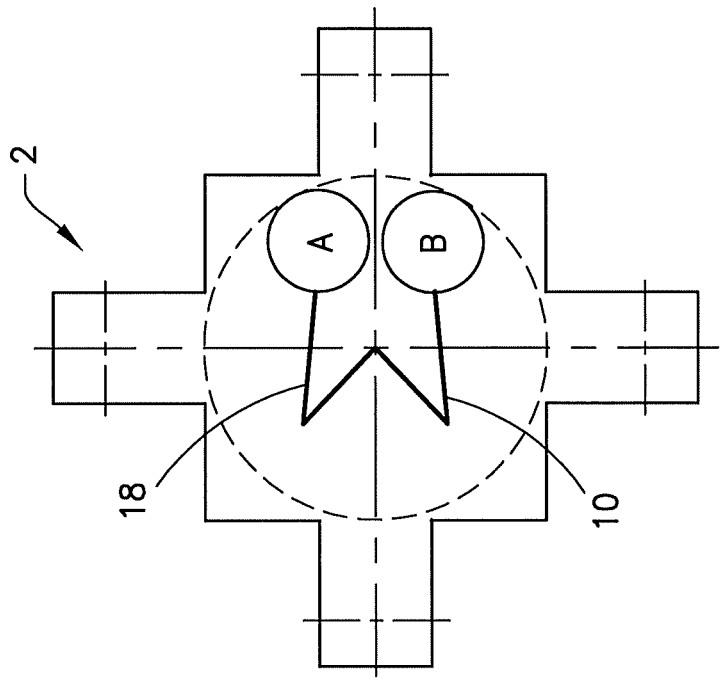
FIGS. 3A-3B are diagrams illustrating example movement of the robot of FIGS. 1-2 in a substrate processing system.
Figure 3A:
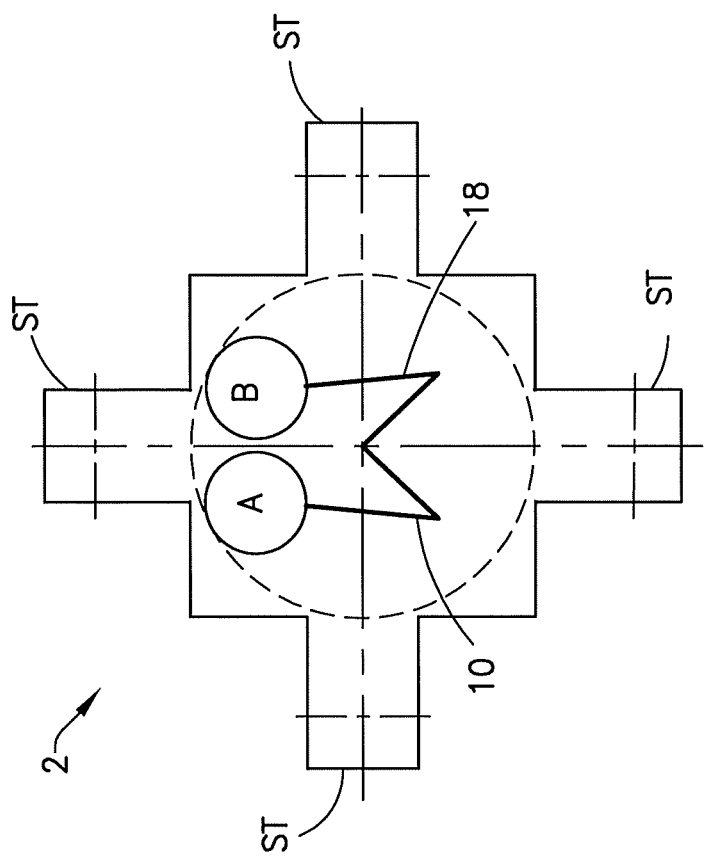

The T1, T2 and T3 shafts of the robot drive unit 16 may be rotated so that the left end-effector A 12 and right end-effector B 14 can access various stations ST, as illustrated diagrammatically in FIGS. 3 and 4, which show diagrams of the robot 10 in an example semiconductor wafer processing system 2.

In order for the entire robot arm 18 to rotate, all drive shafts, i.e., T1, T2 and T3, need to move in the desired direction of rotation of the arm by the same amount with respect to a fixed reference frame. This is depicted diagrammatically by FIGS. 3A and 3B. In this particular example, the entire robot arm 18 rotates in the clockwise direction by 90 degrees.

Figure 4A:
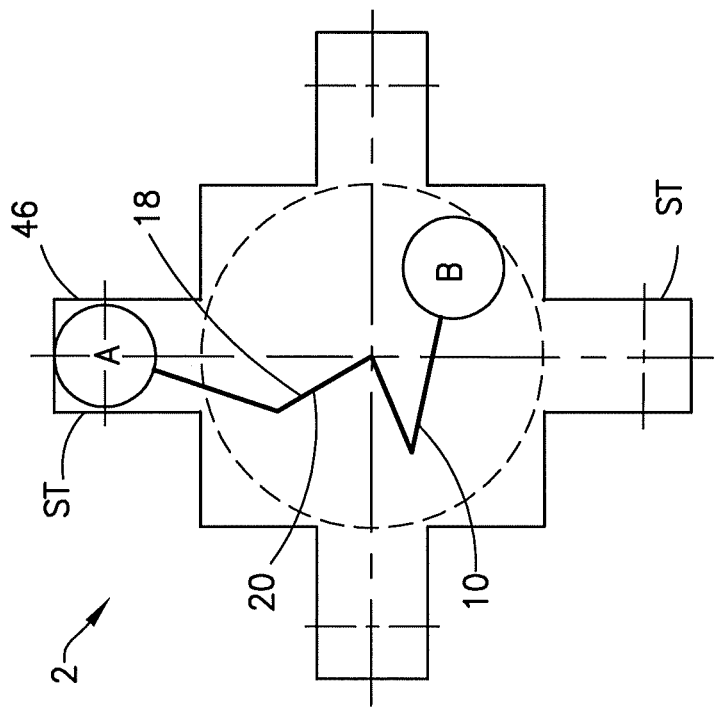
FIGS. 4A-4D are diagrams illustrating example movement of the robot of FIGS. 1-2 in the substrate processing system shown in FIGS. 3A-3B.
Figure 4B:
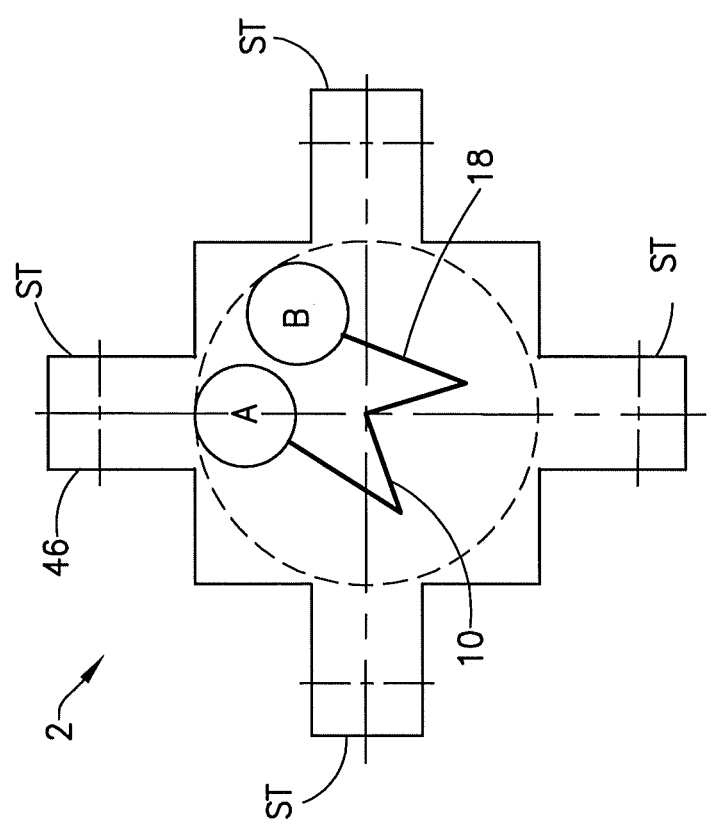

In order for the left end-effector A to extend from the retracted position shown in FIG. 4A to a station along a predefined path, such as a straight-line radial path, as depicted diagrammatically in the example of FIG. 4B, shafts T1 and T2 may rotate in a coordinated manner in the clockwise and counterclockwise directions, respectively. The inverse kinematic equations for the left end-effector A 12 may be utilized to determine the orientation of the T1 and T2 shafts as a function of the position of the left end-effector A 12. As illustrated in FIG. 4B, the right end-effector B 14 may rotate out in sync with the upper arm 20 as the left end-effector A 12 extends to the station ST 46. The left end-effector A may be retracted by rotating the T1 and T2 shafts backward in a similar manner.

Figure 4D:
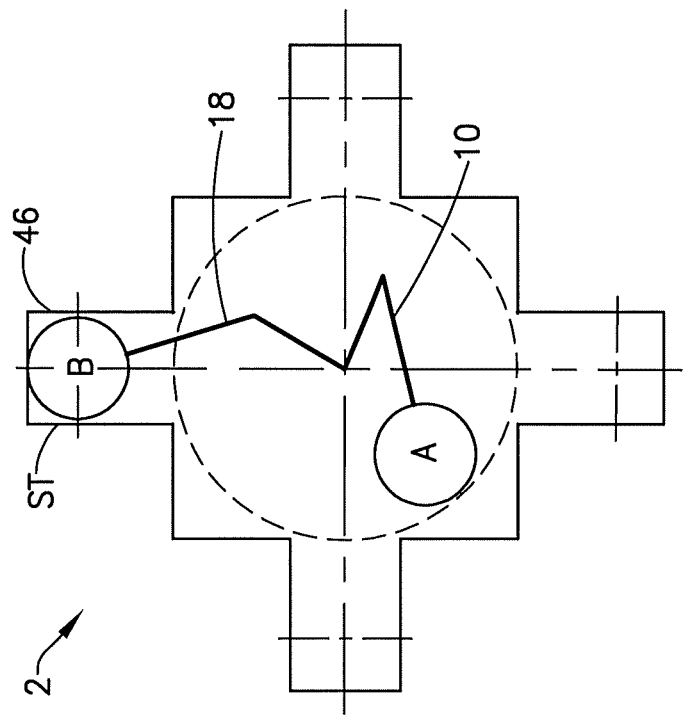
Figure 4C:
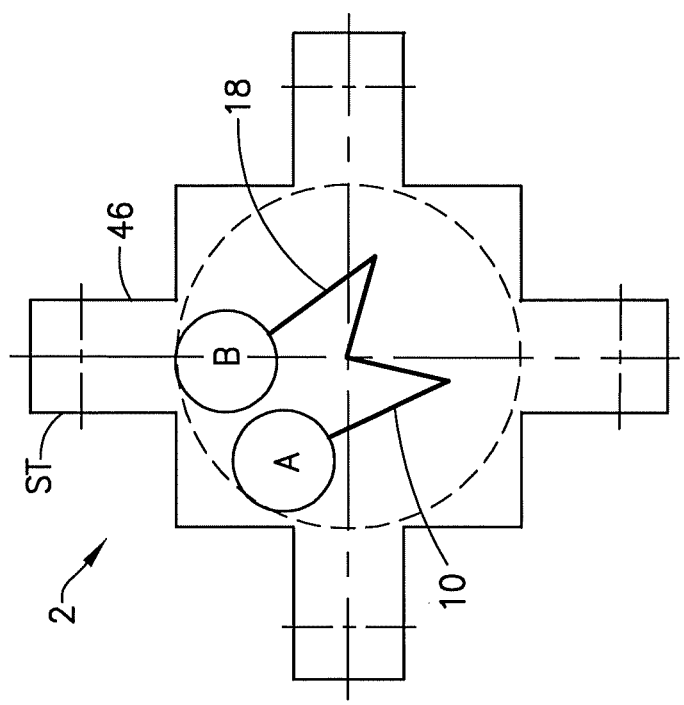

In order for the right end-effector B 14 to extend from the retracted position of FIG. 4C to the same station ST 46 along a predefined path, such as a straight-line radial path, as depicted diagrammatically in the example of FIG. 4D, shafts T1 and T3 may rotate in a coordinated manner in the counterclockwise and clockwise directions, respectively, in accordance with the inverse kinematic equations for the right end-effector B 14. As illustrated in the FIG. 4D, the left end-effector A 12 may swing out in sync with the upper arm 20 as the right end-effector B extends to the station. The right end-effector B 14 may be retracted by rotating the T1 and T3 shafts backward in a similar manner.

The above operations may be utilized to pick/place a wafer from/to a station. A sequence of a pick operation with one end-effector followed by a place operation with the other end-effector may be used to quickly exchange a wafer at a station (rapid exchange operation). As an example, the left end-effector A may be extended to a station, pick a wafer, and retract. The right end-effector B, which may carry another wafer, may then extend to the same station, place the wafer, and retract.

The robot drive unit 16 may include a vertical lift mechanism to control the vertical elevation of the robot arm, which may be used to access stations at different elevations, compensate for the vertical distance between the end-effectors of the robot arm if the end-effectors are not coplanar, and facilitate material pick/place operations.

Although the illustrations of the example embodiment show the left forearm of the robot driven by the T2 shaft and the right forearm of the robot driven by the T3 shaft, any suitable driving schemes and transmission arrangements may be used. Similarly, while straight lines are used to represent the example embodiment in the figures, the upper arm, forearms and end-effectors may feature any suitable shapes, for instance, to avoid interference with obstacles in the workspace of the robot.

Figure 5A:
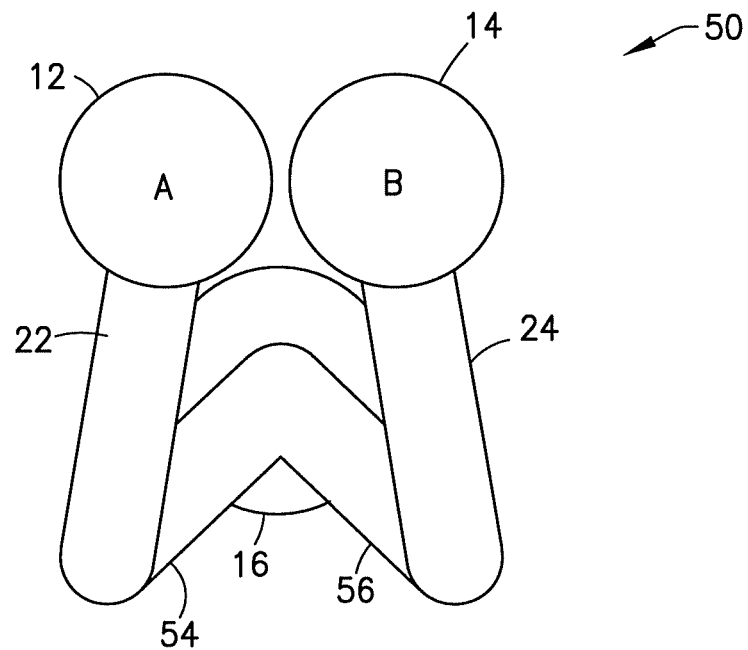
FIG. 5A is a top view of an example embodiment of a robot.
Figure 5B:
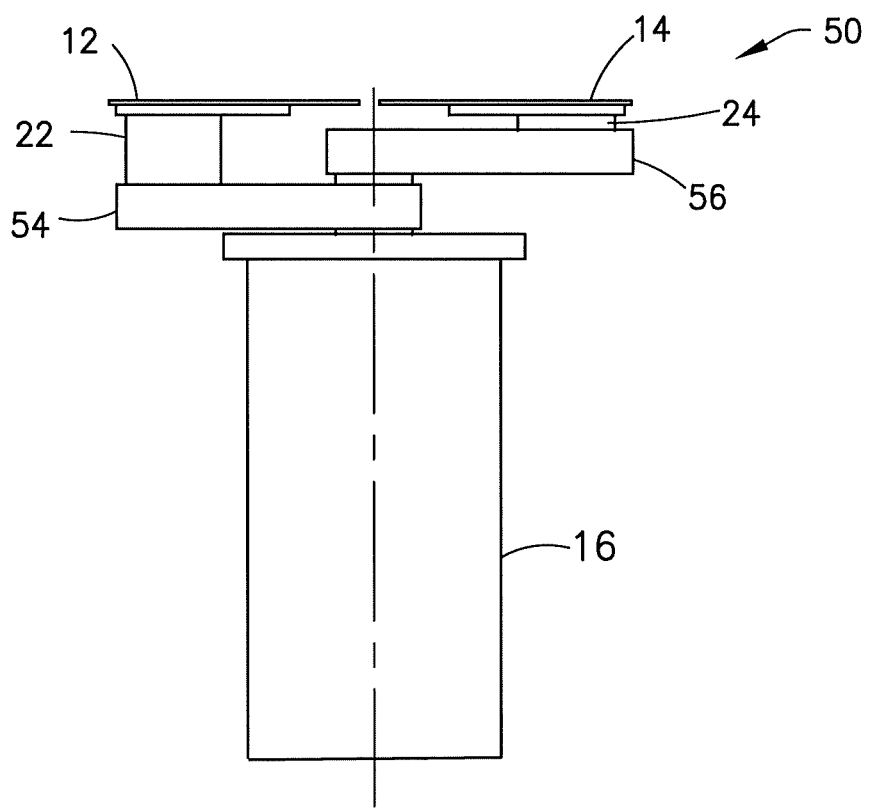
FIG. 5B is a side view of the robot shown in FIG. 5A.

Another example embodiment of a robot with two end-effectors is depicted diagrammatically in FIGS. 5A-5B. FIG. 5A shows the top view of the robot 50 and FIG. 5B depicts the side view of the robot 50. The robot 50 comprises the robot drive unit 16 and a robot arm 52. The robot arm 52 in this example features two linkages, i.e., a left linkage and a right linkage. The left linkage comprises a left upper arm 54 and a left forearm 22 with a left end-effector A 12. Similarly, the right linkage comprises a right upper arm 56 and a right forearm 24 with a right end-effector B 14.

Figure 6:
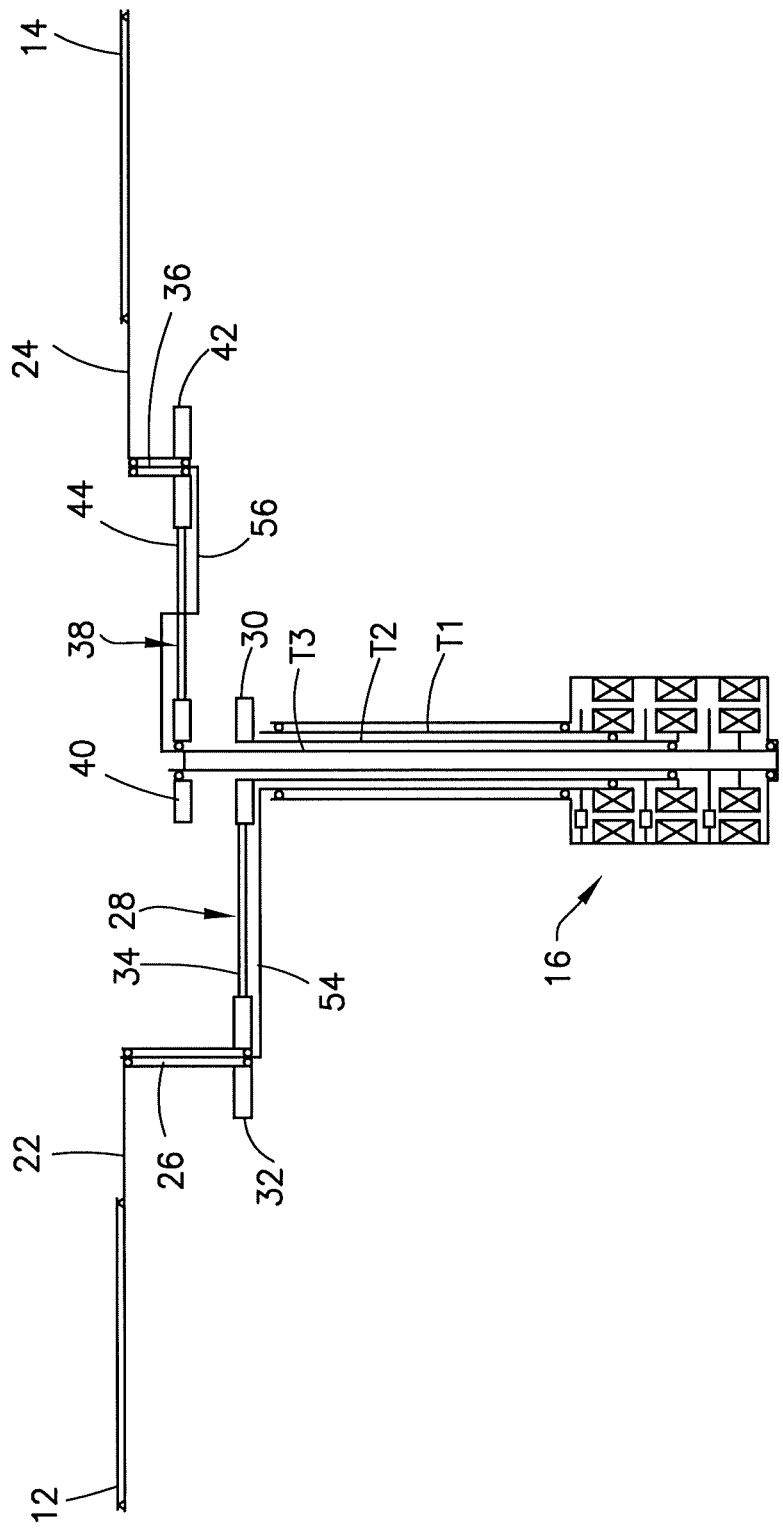
FIG. 6 is a diagram illustrating drive and transmission connections in the robot shown in FIGS. 5A-5B.

An example internal arrangement of the robot is depicted diagrammatically in FIG. 6. The robot arm 52 is configured to be driven by the robot drive unit 16 with a three-axis spindle with three coaxial shafts, e.g., an outer T1 shaft, a T2 shaft and an inner T3 shaft.

The left upper arm 54 of the robot arm 52 is shown attached directly to the T1 shaft in this example. The left forearm 22 is coupled to the left upper arm 54 via a rotary joint (left elbow joint) 26, and actuated by the T2 shaft using the belt arrangement 28. The belt arrangement 28 in this example comprises a left shoulder pulley 30, which may be attached to the T2 shaft, a left elbow pulley 32, which may be attached to the left forearm 22, and a band, belt or cable 34, which is configured to transmit motion between the two pulleys 30, 32. The belt arrangement 28 may feature a constant or variable transmission ratio. As an example, the variable transmission ratio may be selected so that the orientation of the left forearm 22 with the left end-effector A 12 changes in a predefined manner as a function of the relative position of the left upper arm and the T2 shaft. However, any other suitable arrangement may be used.

Similarly, the right upper arm 56 of the robot arm 52 is shown attached directly to the T3 shaft in this example. The right forearm 24 may be coupled to the right upper arm 56 via the rotary joint (right elbow joint) 36, and actuated by the T2 shaft using the belt arrangement 38. The belt arrangement 38 may comprise the right shoulder pulley 40, which may be attached to the T2 shaft, the right elbow pulley 42, which may be attached to the right forearm 24, and the band, belt or cable 44, which may transmit motion between the two pulleys 40, 42. The belt arrangement 38 may feature a constant or variable transmission ratio. As an example, the variable transmission ratio may be selected so that the orientation of the right forearm with the right end-effector B 14 changes in a predefined manner as a function of the relative position of the right upper arm and the T2 shaft. However, any other suitable arrangement may be used.

Figure 7B:
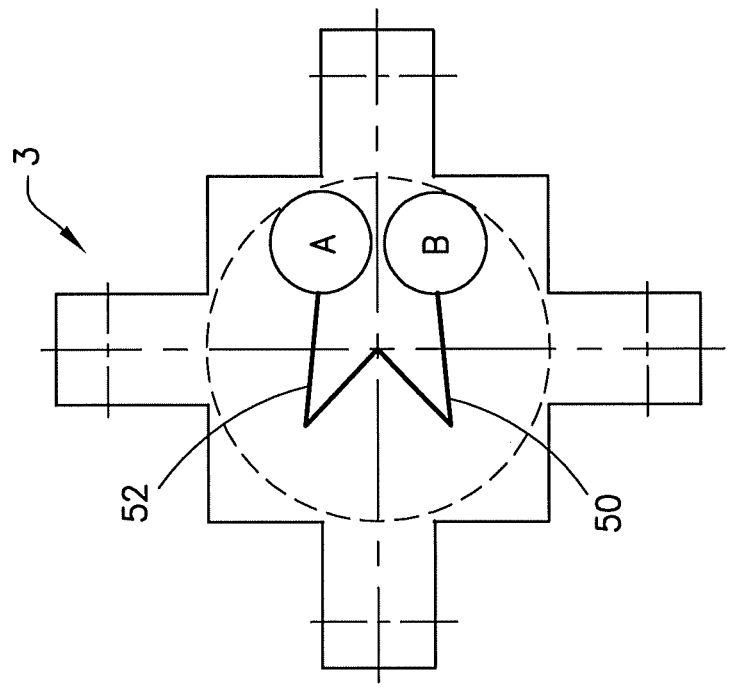
FIGS. 7A-7B are diagrams illustrating example movement of the robot of FIGS. 5-6 in a substrate processing system.
Figure 7A:
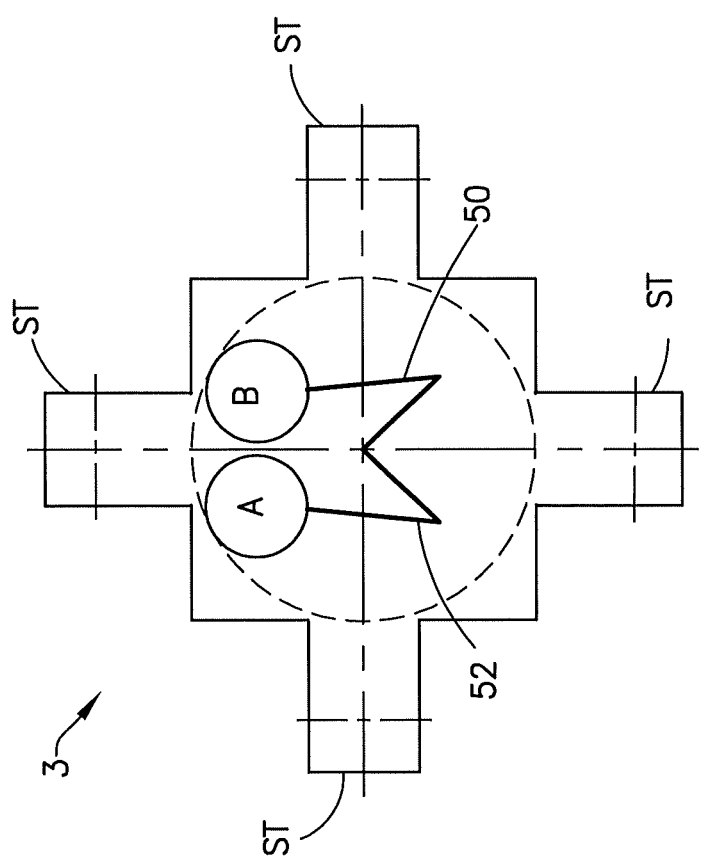

The T1, T2 and T3 shafts of the robot drive unit 16 may be rotated so that the left end-effector A 12 and right end-effector B 14 can access various stations ST, as illustrated diagrammatically in FIGS. 7 and 8, which show diagrams of the robot 50 in an example semiconductor wafer processing system 3.

In order for the entire robot arm 52 to rotate, all drive shafts, i.e., T1, T2 and T3, need to move in the desired direction of rotation of the arm by the same amount with respect to a fixed reference frame. This is depicted diagrammatically in FIGS. 7A-7B. In this particular example, the entire robot arm 52 is shown rotated in the clockwise direction by 90 degrees.

Figure 8B:
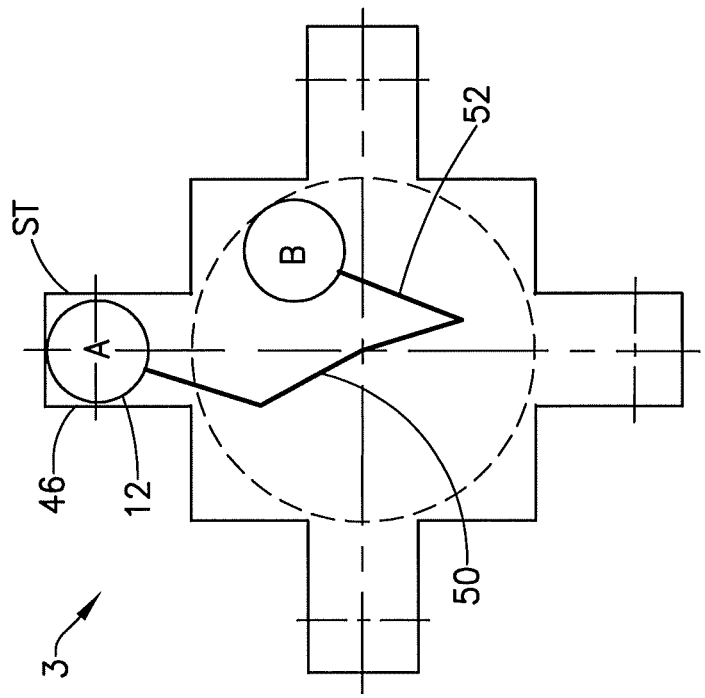
FIGS. 8A-8D are diagrams illustrating example movement of the robot of FIGS. 5-6 in the substrate processing system shown in FIGS. 7A-7B.
Figure 8A:
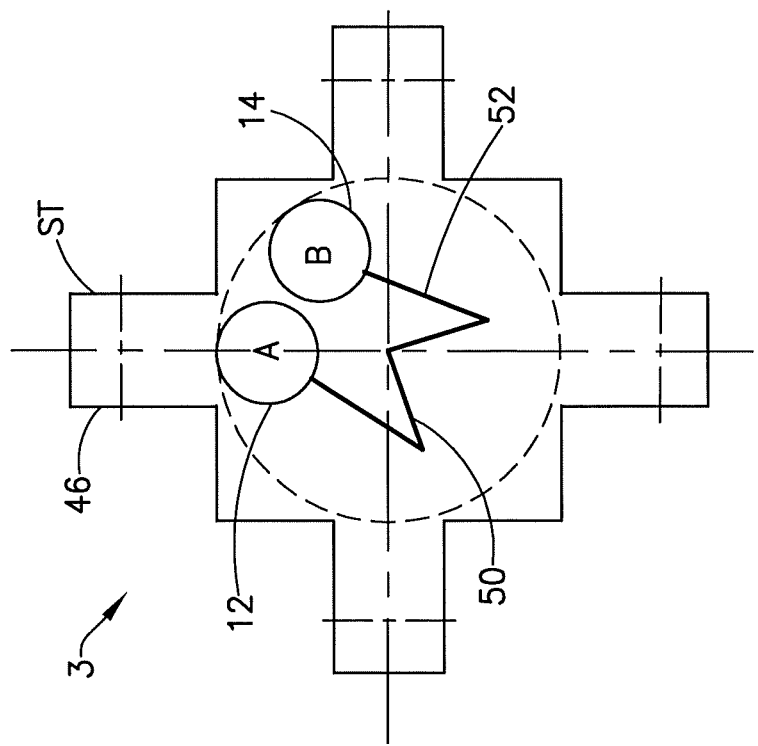

In order for the left end-effector A 12 to extend from the retracted position of FIG. 8A to a station ST 46 along a predefined path, such as a straight-line radial path for example, as depicted diagrammatically in the example of FIG. 8B, shaft T1 may rotate in the clockwise direction while shaft T2 may be held stationary. As illustrated in FIGS. 8A-8B, unlike the example shown in FIGS. 4A-4B, the right end-effector B 14 may remain stationary as the left end-effector A 12 extends to the station ST 46. The left end-effector A 12 may be retracted by rotating the T1 shaft backward in a similar manner.

Figure 8D:
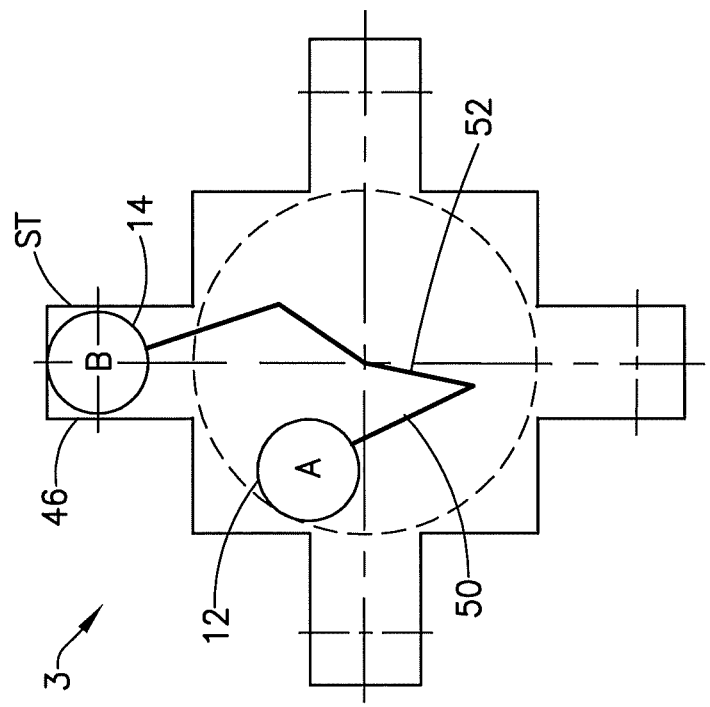
Figure 8C:
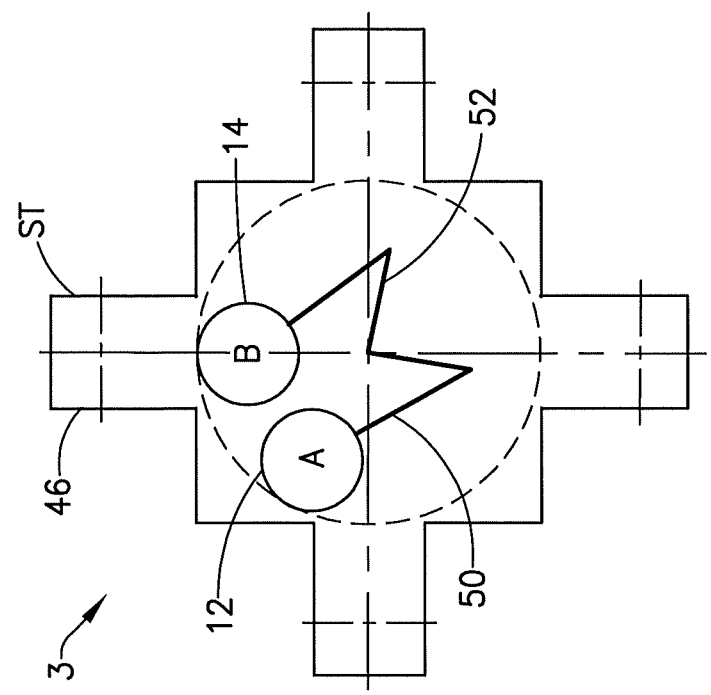

In order for the right end-effector B 14 to extend from the retracted position of FIG. 8C to the same station ST 46 along a predefined path, such as a straight-line radial path for example, as depicted diagrammatically in the example of FIGS. 8C-8D, shafts T3 may rotate in the counterclockwise direction while shaft T2 may be held stationary. As illustrated, the left end-effector A 12 may remain stationary as the right end-effector B 14 extends to the station ST 46. The right end-effector B 14 may be retracted by rotating the T3 shaft backward in a similar manner.

The above operations may be utilized to pick/place a wafer from/to a station. A sequence of a pick operation with one end-effector followed by a place operation with the other end-effector may be used to quickly exchange a wafer at a station (rapid exchange operation). As an example, the left end-effector A 12 may be extended to a station, pick a wafer, and retract. The right end-effector B 14, which may carry another wafer, may then extend to the same station, place the wafer, and retract.

The robot drive unit 16 may include a vertical lift mechanism to control the vertical elevation of the robot arm 52, which may be used to access stations at different elevations, compensate for the vertical distance between the end-effectors of the robot arm if the end-effectors are not coplanar, and facilitate material pick/place operations.

Although the illustrations of the example embodiment show the robot 50 with the left upper arm 22 below the right upper arm 24, and the left and right end-effectors are depicted at the same elevation (coplanar), in alternate embodiments the upper arms and end-effectors may be arranged in various configurations and elevations. Similarly, although the example embodiment shows the left upper 54 of the robot 50 driven by the T1 shaft and the right upper arm 56 of the robot driven by the T3 shaft, any suitable driving schemes and transmission arrangements may be used. Furthermore, while straight lines are used to represent the example embodiment in the figures, the upper arms, forearms and end-effectors may feature any suitable shapes, for instance, to avoid interference with obstacles in the workspace of the robot.

Figure 9A:
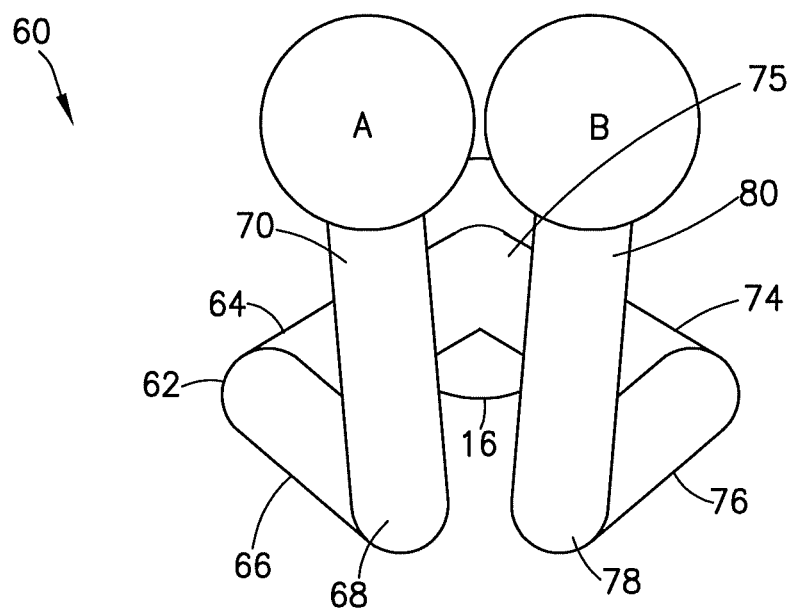
FIG. 9A is a top view of an example embodiment of a robot.
Figure 9B:
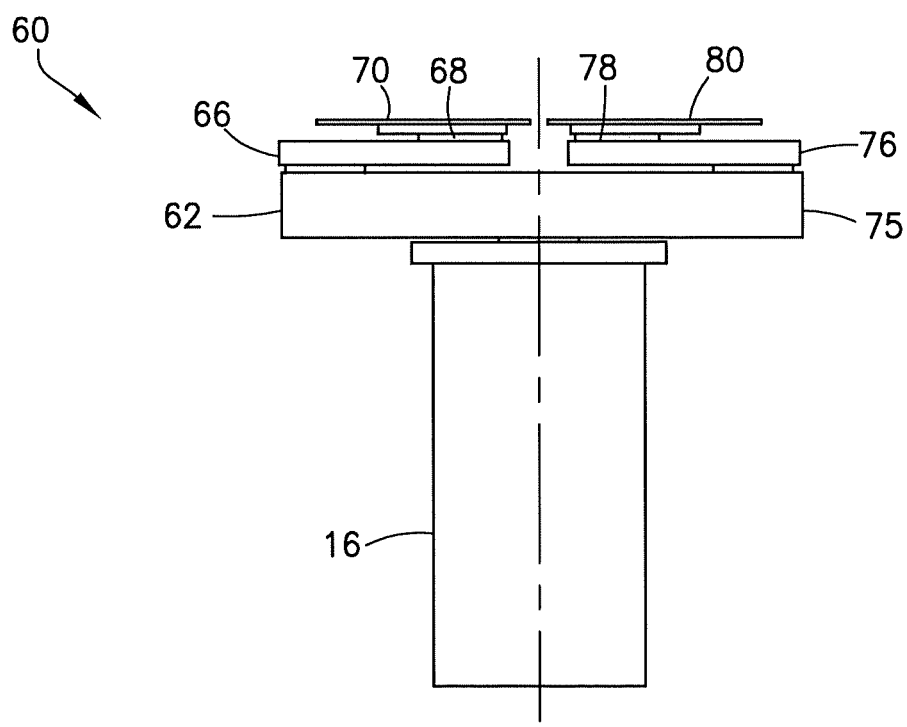
FIG. 9B is a side view of the robot shown in FIG. 9A.

Another example embodiment of a robot with two end-effectors is depicted diagrammatically in FIGS. 9A-9B. FIG. 9A shows a top view of a robot 60 and FIG. 9B depicts a side view of the robot 60. The robot 60 may comprise the robot drive unit 16 and a robot arm 62. The robot arm 62 may feature two linkages, i.e., a left linkage and a right linkage.

The left linkage in this example comprises an upper arm 64, a left forearm 66 and left wrist 68 with a left end-effector A 70. Similarly, the right linkage in this example comprises a upper arm 74, a right forearm 76 and a right wrist 78 with a right end-effector B 80. The upper arms 64, 74 of the left and right linkages are rigidly connected together, and can be viewed as a single shared link 75.

Figure 10:
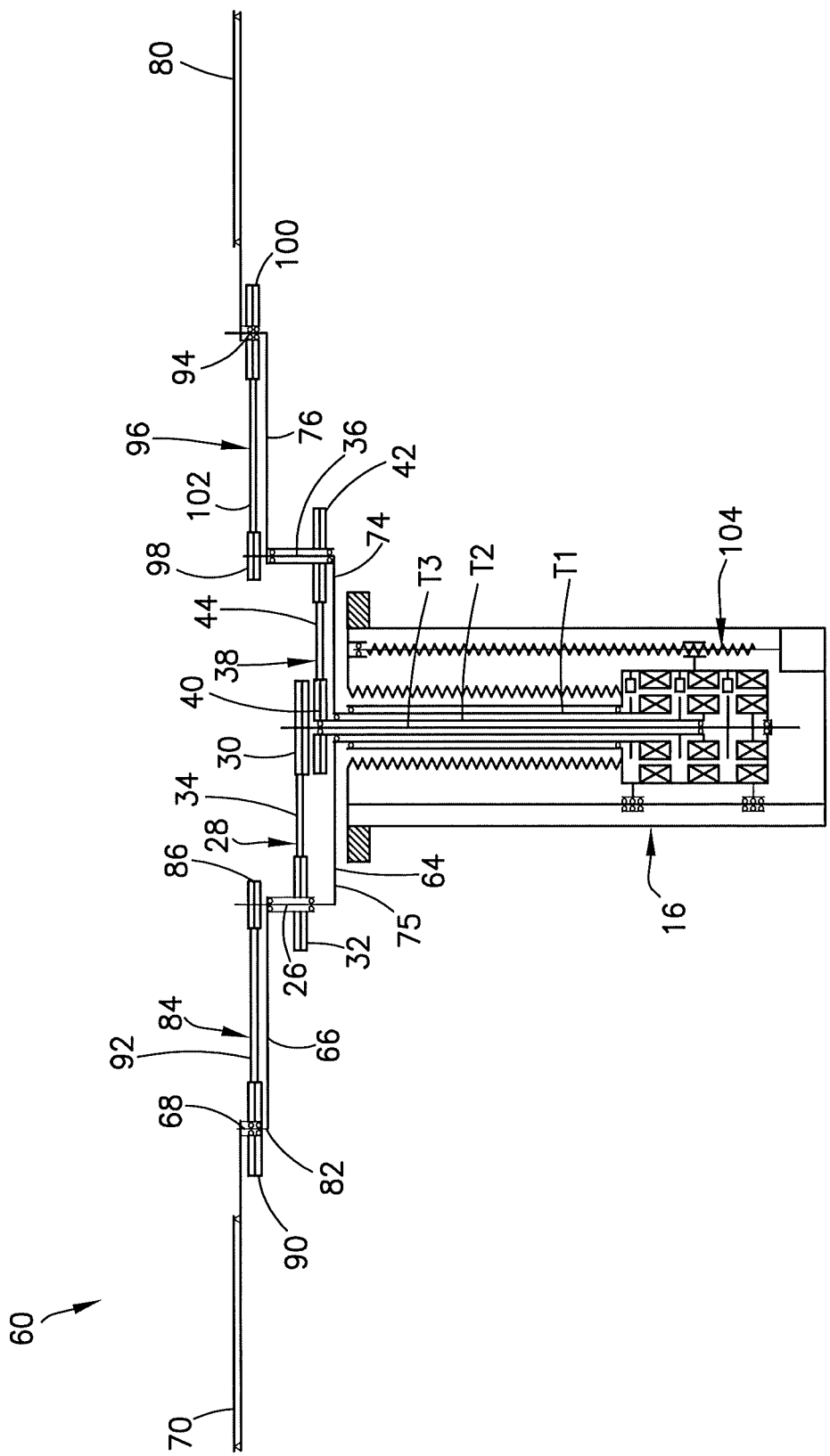
FIG. 10 is a diagram illustrating drive and transmission connections in the robot shown in FIGS. 9A-9B.

An example internal arrangement of the robot 60 is depicted diagrammatically in FIG. 10. The robot arm 62 may be driven by the robot drive unit 16 with a three-axis spindle with three coaxial shafts, e.g., an outer T1 shaft, a T2 shaft and an inner T3 shaft.

The upper arm link 75 of the robot arm 62 may be attached directly to the T1 shaft. The left forearm 66 may be coupled to the upper arm link 75 via a rotary joint (left elbow joint) 26, and actuated by the T2 shaft using a belt arrangement 28. The belt arrangement 28 may comprise a left shoulder pulley 30, which may be attached to the T2 shaft, a left elbow pulley 32, which may be attached to the left forearm 66, and a band, belt or cable 34, which may transmit motion between the two pulleys 30, 32.

The left wrist 68 with the left end-effector A 70 may be coupled to the left forearm 66 via a rotary joint (left wrist joint) 82, and rotationally constrained by another belt arrangement 84. The belt arrangement 84 may comprise a second left elbow pulley 86, which may be attached to the upper arm 64, a left wrist pulley 90, which may be attached to the left wrist 68, and a band, belt or cable 92, which may transmit motion between the two pulleys 86, 90. The belt arrangement 84 may feature a variable transmission ratio. As an example, the variable transmission ratio may be selected so that the orientation of the left wrist 68 changes in a predefined manner as a function of the relative angle of the upper arm 64 and the left forearm 66. However, any other suitable arrangement may be used.

The right linkage may be conceptually viewed as a mirror image of the left linkage. The right forearm 76 may be coupled to the upper arm 74 via a rotary joint (right elbow joint) 36, and actuated by the T3 shaft using a belt arrangement 38. The belt arrangement 38 may comprise a right shoulder pulley 40, which may be attached to the T3 shaft, a right elbow pulley 42, which may be attached to the right forearm 76, and a band, belt or cable 44, which may transmit motion between the two pulleys 40, 42.

The right wrist 78 with the right end-effector B 80 may be coupled to the right forearm 76 via a rotary joint (right wrist joint) 94, and rotationally constrained by another belt arrangement 96. The belt arrangement 96 may comprise a second right elbow pulley 98, which may be attached to the upper arm 74, a right wrist pulley 100, which may be attached to the right wrist 78, and a band, belt or cable 102, which may transmit motion between the two pulleys 98, 100. The belt arrangement 96 may feature a variable transmission ratio. As an example, the variable transmission ratio may be selected so that the orientation of the right wrist 78 changes in a predefined manner as a function of the relative angle of the right upper arm 74 and the right forearm 76. However, any other suitable arrangement may be used.

As an example, the variable-transmission belt arrangements may be conveniently designed so that, as the arm extends from its retracted position to a station, the orientation of the end-effector gradually aligns with the radial path to the station and then remains unchanged relative to the radial path to the station. Consequently, the relative orientation of the end-effector may be the same when the arm is extended to stations in different radial locations.

The T1, T2 and T3 shafts of the robot drive unit may be rotated so that the left end-effector A and right end-effector B can access various stations, as illustrated diagrammatically in FIGS. 11-12, which show diagrams of the robot 60 in an example semiconductor wafer processing system 4.

In order for the entire robot arm to rotate, all drive shafts, i.e., T1, T2 and T3, need to move in the desired direction of rotation of the arm 62 by the same amount with respect to a fixed reference frame. This is depicted diagrammatically in FIGS. 11A-11B. In this particular example, the entire robot arm 62 rotates in the clockwise direction by 90 degrees.

Figure 12B:
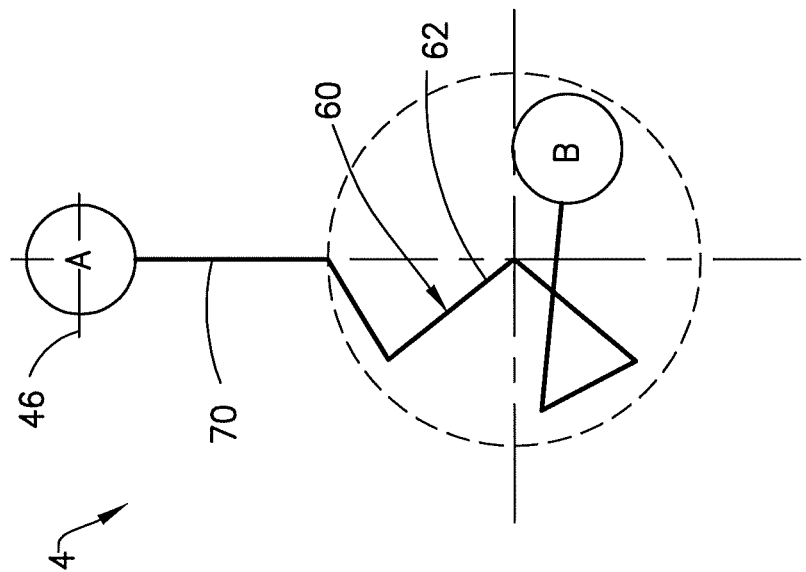
FIGS. 12A-12D are diagrams illustrating example movement of the robot of FIGS. 9-10 in the substrate processing system shown in FIGS. 11A-11B.
Figure 12A:
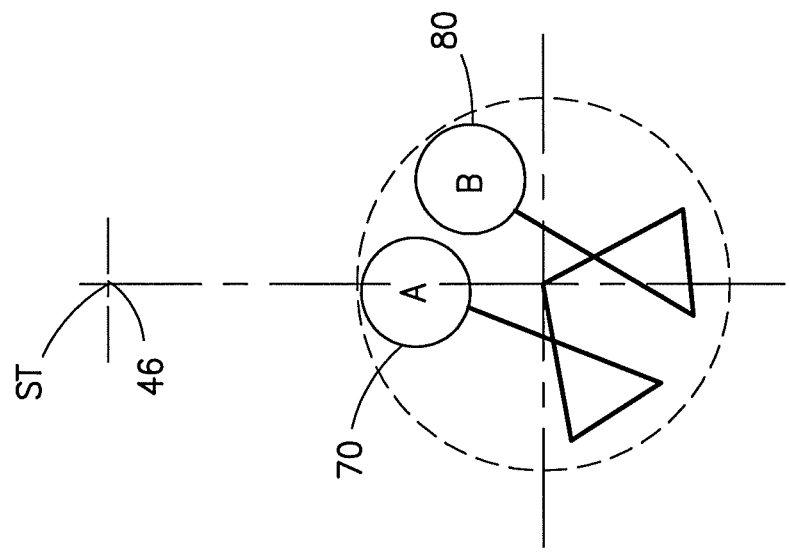

In order for the left end-effector A 70 to extend from the retracted position of FIG. 12A to a station ST 46 along a predefined path, such as a straight-line radial path for example, as depicted diagrammatically in the example of FIG. 12B, shaft T1 may rotate in the clockwise direction while shaft T2 may be held stationary. As illustrated in FIGS. 12A-12B, the right end-effector B 80 may rotate as the left end-effector A 70 extends to the station ST 46. In an example embodiment the variable-transmission belt arrangements may be conveniently designed so that the orientation of the left end-effector does not change with extension over the final portion of the move, which means that the relative orientation of the end-effector may be the same when extended to stations in different radial locations. The left end-effector A 70 may be retracted by rotating the T1 shaft backward in a similar manner.

Figure 12D:
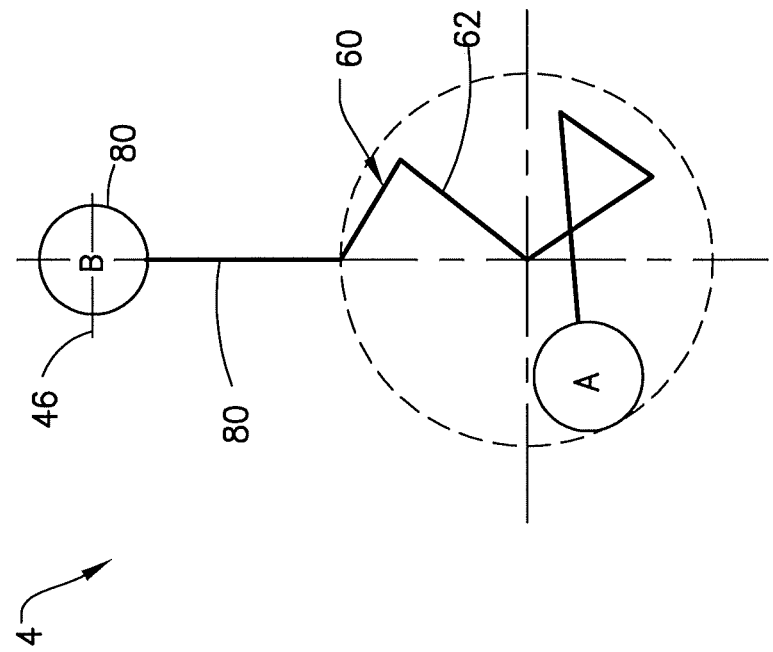
Figure 12C:
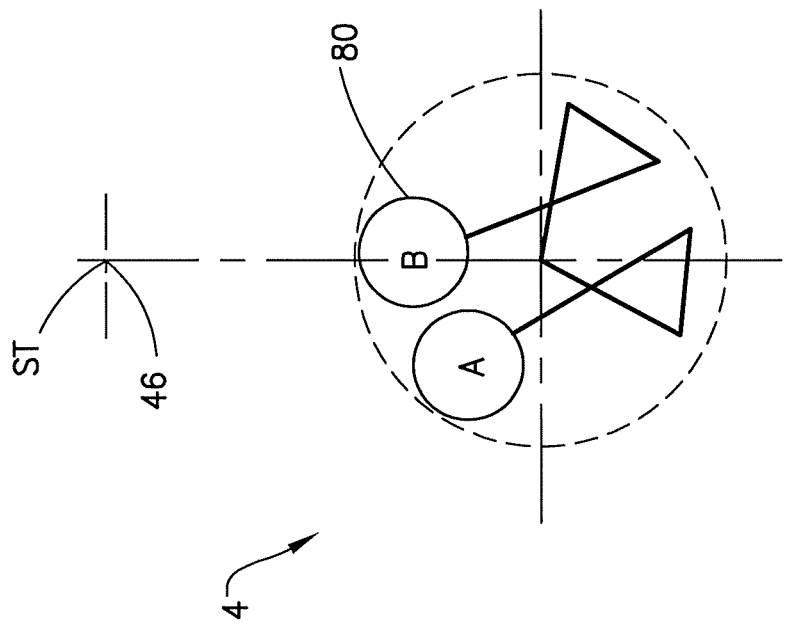

In order for the right end-effector B 80 to extend from the retracted position of FIG. 12C to the same station along a predefined path, such as a straight-line radial path for example, as depicted diagrammatically in the example of FIG. 12D, shafts T3 may rotate in the counterclockwise direction while shaft T2 may be held stationary. As illustrated in the figures, the left end-effector A 70 may rotate as the right end-effector B 80 extends to the station ST 46. In an example embodiment the variable-transmission belt arrangements may be conveniently designed so that the orientation of the left end-effector does not change with extension over the final portion of the move, which means that the relative orientation of the end-effector may be the same when extended to stations in different radial locations. The right end-effector B 80 may be retracted by rotating the T3 shaft backward in a similar manner.

The above operations may be utilized to pick/place a wafer from/to a station ST. A sequence of a pick operation with one end-effector followed by a place operation with the other end-effector may be used to quickly exchange a wafer at a station (rapid exchange operation). As an example, the left end-effector A 70 may be extended to a station, pick a wafer, and retract. The right end-effector B 80, which may carry another wafer, may then extend to the same station, place the wafer, and retract.

As depicted diagrammatically in FIG. 10, the robot drive unit may include a vertical lift mechanism 104 to control the vertical elevation of the robot arm 60, which may be used to access stations ST at different elevations, compensate for the vertical distance between the end-effectors of the robot arm if the end-effectors are not coplanar, and facilitate material pick/place operations.

Although the illustrations of the example embodiment show the robot 60 with the left upper arm below the right upper arm, and the left and right end-effectors are depicted at the same elevation (coplanar), the upper arms and end-effectors may be arranged in various configurations and elevations. Similarly, although the example embodiment shows the left upper of the robot 60 driven by the T1 shaft and the right upper arm of the robot driven by the T3 shaft, any suitable driving schemes and transmission arrangements may be used. Furthermore, while straight lines are used to represent the example embodiment in the figures, the upper arms, forearms and end-effectors may feature any suitable shapes, for instance, to avoid interference with obstacles in the workspace of the robot.

Figure 13A:
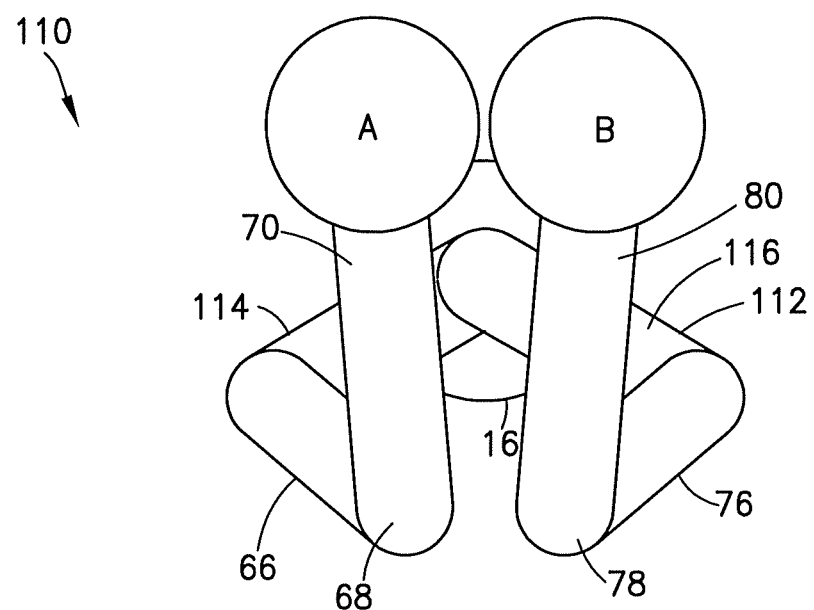
FIG. 13A is a top view of an example embodiment of a robot.
Figure 13B:
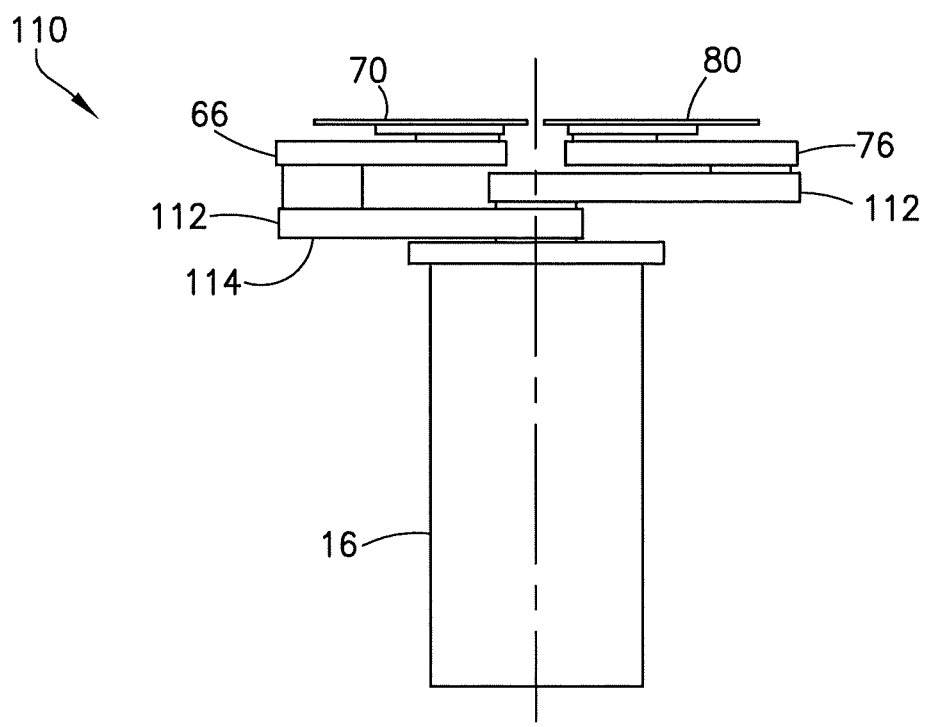
FIG. 13B is a side view of the robot shown in FIG. 13A.

Another example embodiment of a robot with two end-effectors is depicted diagrammatically in FIGS. 13A-13B. FIG. 13A shows a top view of the robot 110 and FIG. 13B depicts a side view of the robot 110. The robot 110 may consist of a robot drive unit 16 and a robot arm 112. The robot arm 112 may feature two linkages, i.e., a left linkage and a right linkage.

The left linkage in this example comprises a left upper arm 114, the left forearm 66 and left wrist 68 with the left end-effector A 70. Similarly, the right linkage in this example comprises a right upper arm 116, the right forearm 76 and the right wrist 78 with the right end-effector B 80.

Figure 14:
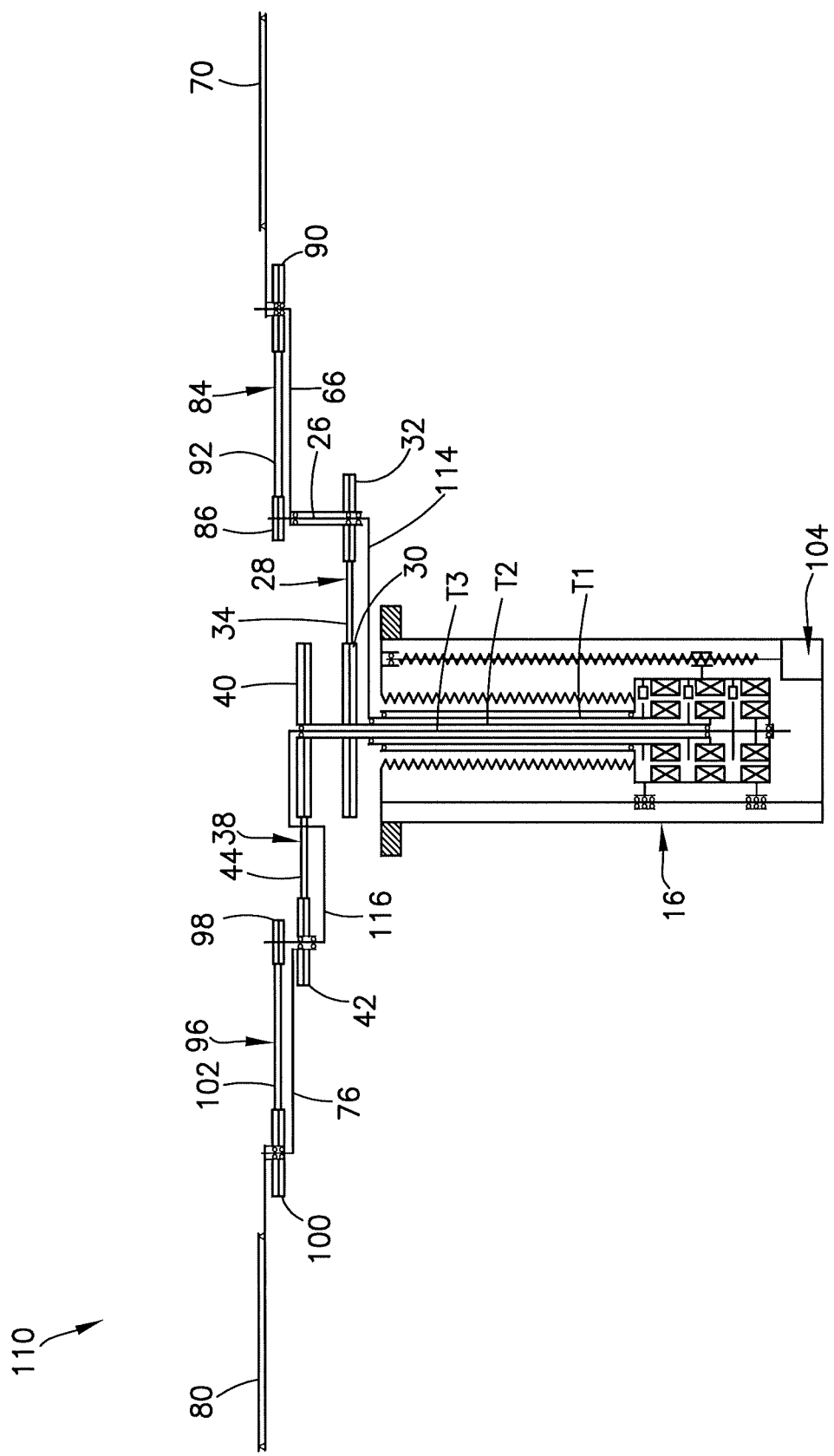
FIG. 14 is a diagram illustrating drive and transmission connections in the robot shown in FIGS. 13A-13B.

An example internal arrangement of the robot is depicted diagrammatically in FIG. 14. The robot arm 112 may be driven by the robot drive unit 16 with a three-axis spindle with three coaxial shafts, e.g., an outer T1 shaft, a T2 shaft and an inner T3 shaft.

The left upper arm 114 of the robot arm 112 may be attached directly to the T1 shaft. The left forearm 66 may be coupled to the left upper arm 114 via a rotary joint (left elbow joint) 26, and actuated by the T2 shaft using a belt arrangement 28. The belt arrangement 28 may comprise a left shoulder pulley 30, which may be attached to the T2 shaft, a left elbow pulley 32, which may be attached to the left forearm, and a band, belt or cable 34, which may transmit motion between the two pulleys 30, 32. The belt arrangement 28 may feature a variable transmission ratio. As an example, the variable transmission ratio may be selected so that the orientation of the left forearm 66 changes in a predefined manner as a function of the relative position of the left upper arm 114 and the T2 shaft. However, any other suitable arrangement may be used.

The left wrist 78 with the left end-effector A 70 may be coupled to the left forearm 66 via a rotary joint (right wrist joint), and rotationally constrained by another belt arrangement 84. The belt arrangement 84 may comprise a second left elbow pulley 86, which may be attached to the left upper arm 114, a left wrist pulley 90, which may be attached to the left wrist 68, and a band, belt or cable 92, which may transmit motion between the two pulleys 86, 90. The belt arrangement 84 may feature a variable transmission ratio. As an example, the variable transmission ratio may be selected so that the orientation of the left wrist changes in a predefined manner as a function of the relative angle of the left upper arm and the left forearm. However, any other suitable arrangement may be used.

The right linkage may be conceptually viewed as a mirror image of the left linkage. The right upper arm 116 of the robot arm 112 may be attached directly to the T3 shaft. The right forearm 76 may be coupled to the right upper arm 112 via a rotary joint (right elbow joint), and actuated by the T2 shaft using a belt arrangement 38. The belt arrangement 38 may comprise a right shoulder pulley 40, which may be attached to the T2 shaft, a right elbow pulley 42, which may be attached to the right forearm, and a band, belt or cable 44, which may transmit motion between the two pulleys 40, 42. The belt arrangement 38 may feature a constant or variable transmission ratio. As an example, the variable transmission ratio may be selected so that the orientation of the right forearm changes in a predefined manner as a function of the relative position of the right upper arm and the T2 shaft. However, any other suitable arrangement may be used.

Similarly, the right wrist 78 with a right end-effector B 80 may be coupled to the right forearm 76 via a rotary joint (left wrist joint), and rotationally constrained by another belt arrangement 96. The belt arrangement 96 may comprise a second right elbow pulley 98, which may be attached to the right upper arm 116, a right wrist pulley 100, which may be attached to the right wrist 78, and a band, belt or cable 102, which may transmit motion between the two pulleys 98, 100. The belt arrangement 96 may feature a variable transmission ratio. As an example, the variable transmission ratio may be selected so that the orientation of the right wrist changes in a predefined manner as a function of the relative angle of the right upper arm and the right forearm. However, any other suitable arrangement may be used.

As an example, the variable-transmission belt arrangements may be conveniently designed so that, as the arm extends from its retracted position to a station, the orientation of the end-effector gradually aligns with the radial path to the station and then remains unchanged relative to the radial path to the station. Consequently, the relative orientation of the end-effector may be the same when the arm is extended to stations in different radial locations.

The T1, T2 and T3 shafts of the robot drive unit may be rotated so that the left end-effector A and right end-effector B can access various stations, as illustrated diagrammatically in FIGS. 15-16, which show diagrams of the robot 110 in an example semiconductor wafer processing system 5.

In order for the entire robot arm 112 to rotate, all drive shafts, i.e., T1, T2 and T3, need to move in the desired direction of rotation of the arm 112 by the same amount with respect to a fixed reference frame. This is depicted diagrammatically in FIGS. 15A-15B. In this particular example, the entire robot arm 112 rotates in the clockwise direction by 90 degrees.

Figure 16B:
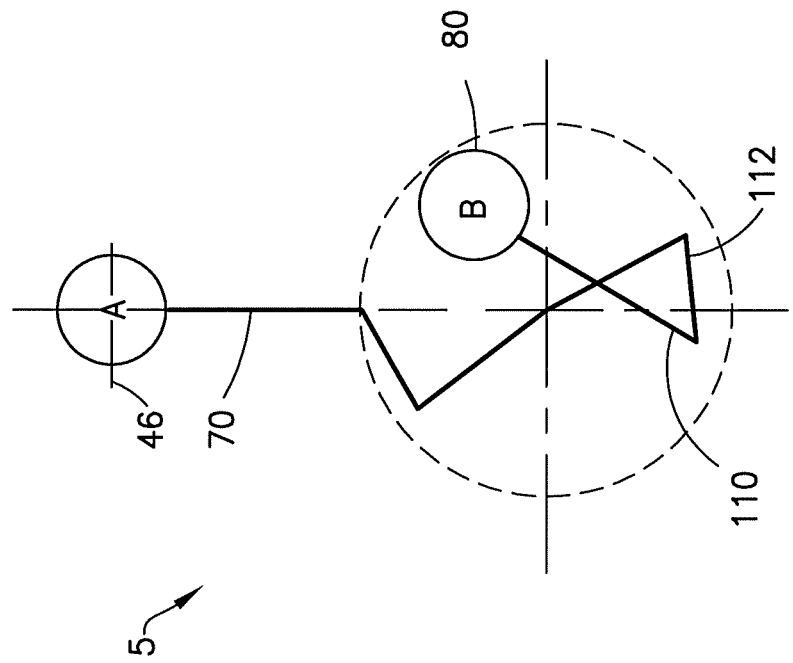
FIGS. 16A-16D are diagrams illustrating example movement of the robot of FIGS. 13-14 in the substrate processing system shown in FIGS. 15A-15B.
Figure 16A:
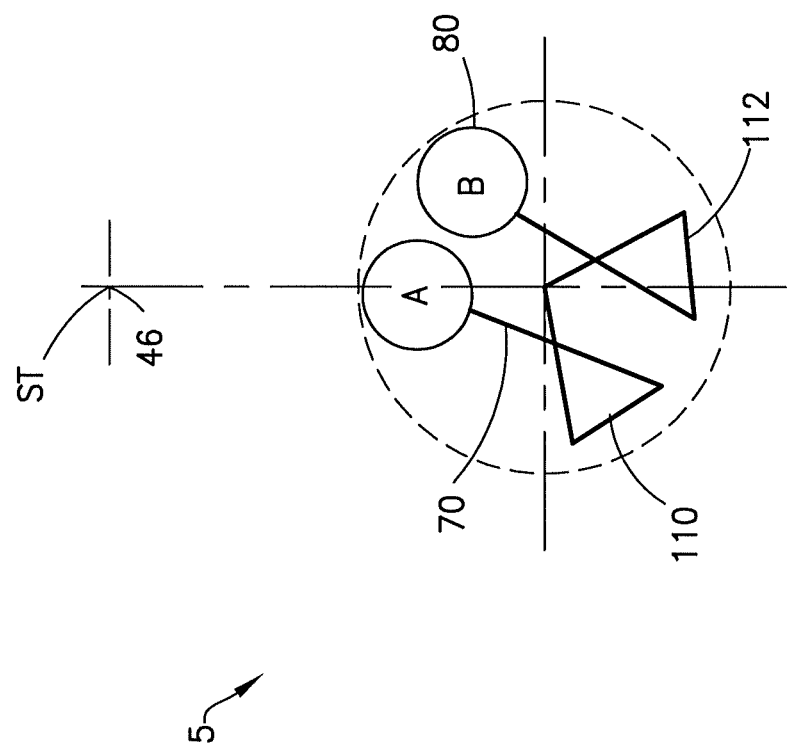

In order for the left end-effector A 70 to extend from the retracted position of FIG. 16A to a station ST 46 along a predefined path, such as a straight-line radial path for example, as depicted diagrammatically in the example of FIGS. 16A-16B, shaft T1 may rotate in the clockwise direction while shaft T2 may be held stationary. As illustrated in the figures, the right end-effector B 80 may remain stationary as the left end-effector A 70 extends to the station ST 46. The variable-transmission belt arrangements may be conveniently designed so that the orientation of the left end-effector does not change with extension over the final portion of the move, which means that the relative orientation of the end-effector may be the same when extended to stations in different radial locations. The left end-effector A 70 may be retracted by rotating the T1 shaft backward in a similar manner.

Figure 16D:
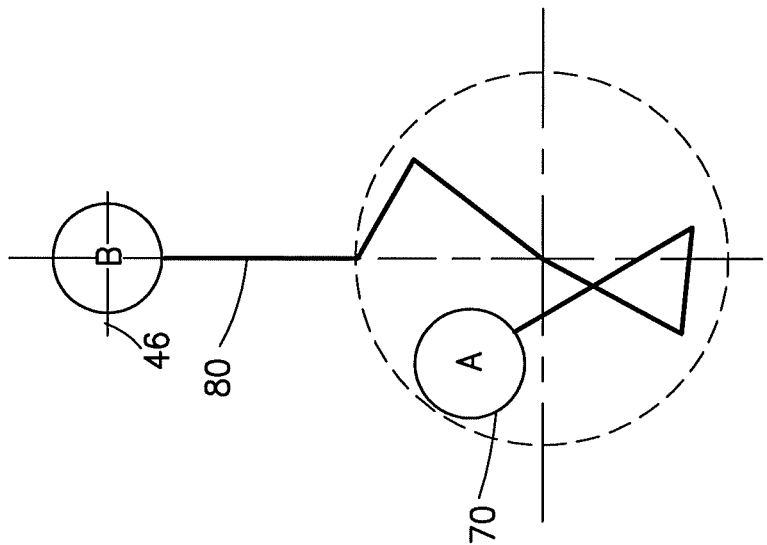
Figure 16C:
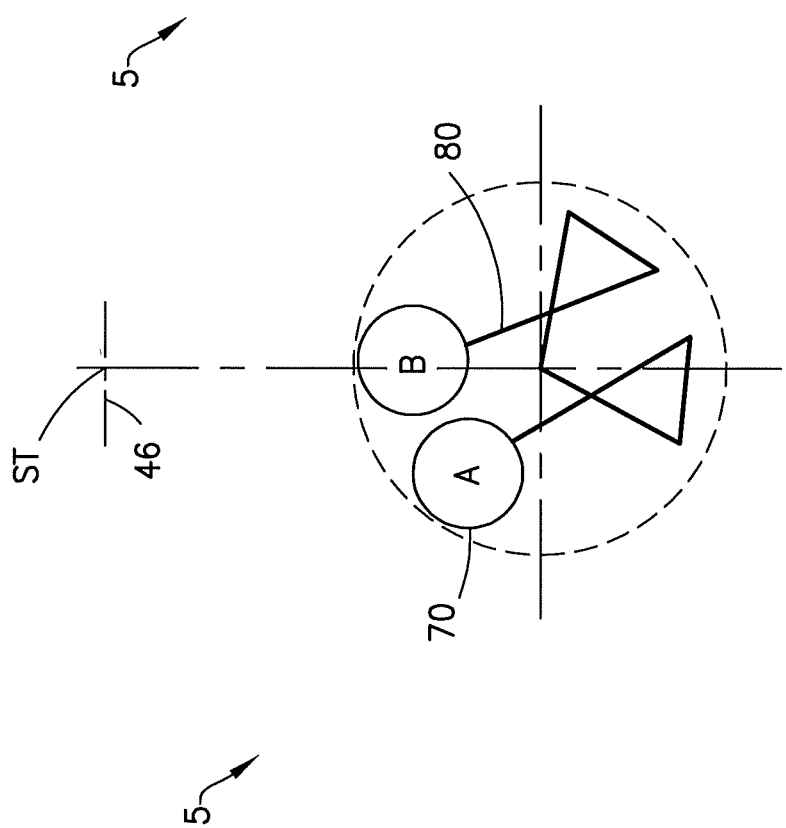

In order for the right end-effector B 80 to extend from the retracted position of FIG. 16C to the same station ST 46 along a predefined path, such as a straight-line radial path for example, as depicted diagrammatically in the example of FIGS. 16C-16D, shafts T3 may rotate in the counterclockwise direction while shaft T2 may be held stationary. As illustrated in the figures, the left end-effector A 70 may remain stationary as the right end-effector B 80 extends to the station ST 46. The variable-transmission belt arrangements may be conveniently designed so that the orientation of the left end-effector does not change with extension over the final portion of the move, which means that the relative orientation of the end-effector may be the same when extended to stations in different radial locations. The right end-effector B 80 may be retracted by rotating the T3 shaft backward in a similar manner.

The extension motion from the retracted position of FIG. 16A to the extended position of FIG. 16B is further illustrated in FIGS. 17A-17D, which shows intermediate phases of the motion. FIGS. 17A-17D show the two different types of paths P1 and P2 which the substrate supporting area SSA of the first end effector 70 travels between the retracted first position shown in FIG. 17A to the extended position inside the substrate processing module 46 shown in FIG. 17D. The first path P1 is curved. The second path P2 is straight. In the first path P1 from FIG. 17A to FIG. 17B the SSA is moved from the retracted first position shown in FIG. 17A to the start of the second path P2 shown in FIG. 17B. From the start of the second path P2 shown in FIG. 17B, the SSA is then moved forward into the station 46 with the end effector 70 straightening out and the SSA traveling along the straight line of the second path P2.

The above operations may be utilized to pick/place a wafer from/to a station ST 46. A sequence of a pick operation with one end-effector followed by a place operation with the other end-effector may be used to quickly exchange a wafer at a station (rapid exchange operation). As an example, the left end-effector A 70 may be extended to the station ST 46, pick a wafer, and retract. The right end-effector B 80, which may carry another wafer, may then extend to the same station ST 46, place the wafer, and retract.

As depicted diagrammatically in FIG. 14, the robot drive unit may include a vertical lift mechanism 104 to control the vertical elevation of the robot arm 112, which may be used to access stations ST at different elevations, compensate for the vertical distance between the end-effectors of the robot arm if the end-effectors are not coplanar, and facilitate material pick/place operations.

Although the illustrations of the example embodiment show the robot 110 with the left upper arm below the right upper arm, and the left and right end-effectors are depicted at the same elevation (coplanar), the upper arms and end-effectors may be arranged in various configurations and elevations. Similarly, although the example embodiment shows the left upper arm of the robot 110 driven by the T1 shaft and the right upper arm of the robot 110 driven by the T3 shaft, any suitable driving schemes and transmission arrangements may be used. Furthermore, while straight lines are used to represent the example embodiment in the figures, the upper arms, forearms and end-effectors may feature any suitable shapes, for instance, to avoid interference with obstacles in the workspace of the robot.

Figure 18A:
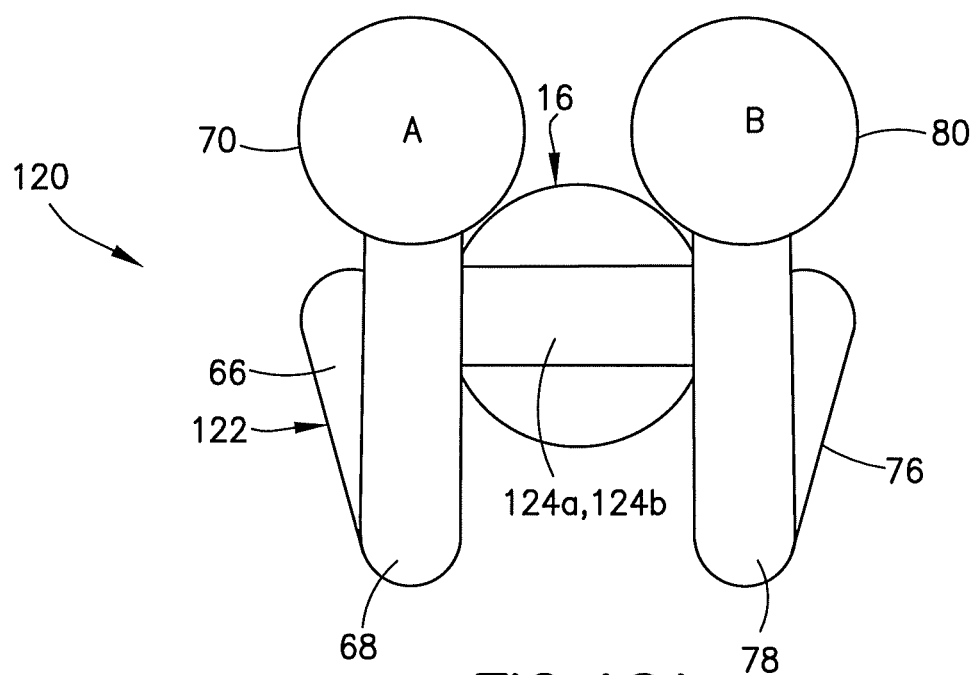
FIG. 18A is a top view of an example embodiment of a robot.
Figure 18B:
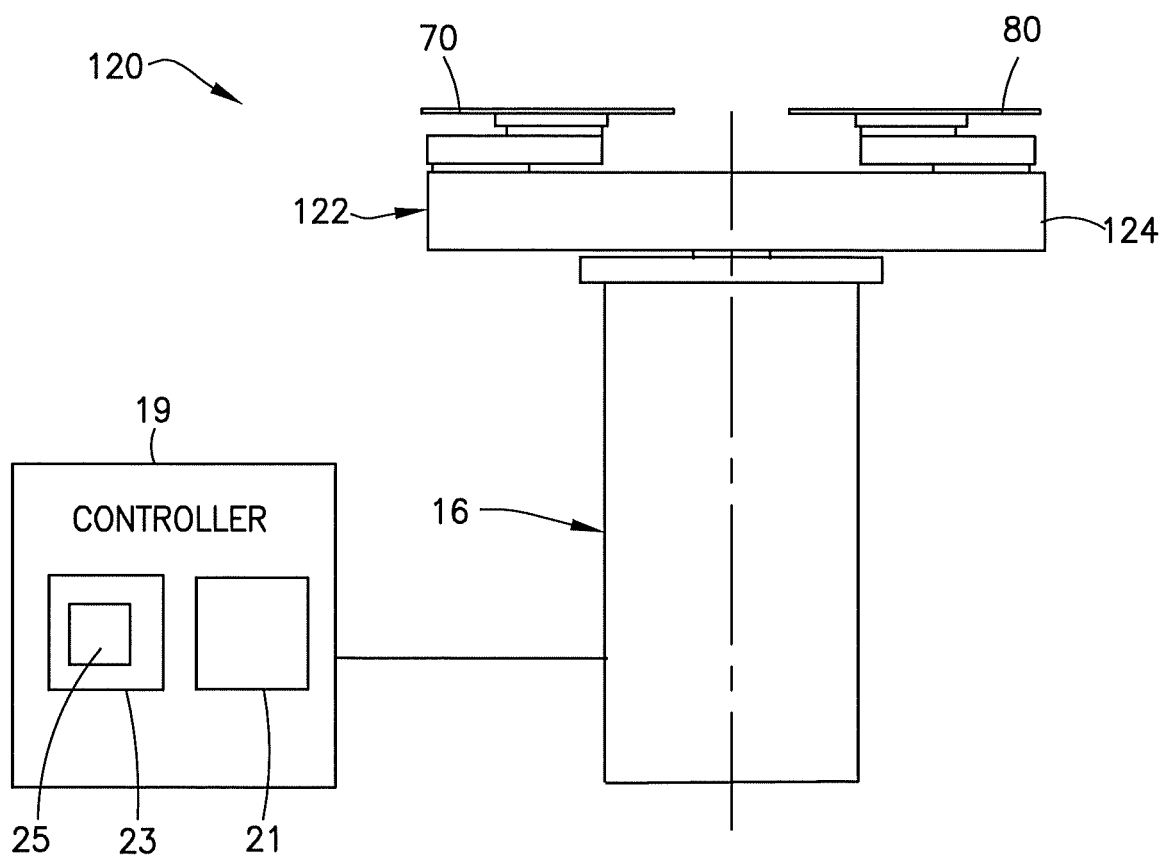
FIG. 18B is a side view of the robot shown in FIG. 18A.

Another example embodiment of a robot with two end-effectors is depicted diagrammatically in FIGS. 18A-18B. FIG. 18A shows a top view of the robot 120 and FIG. 18B depicts a side view of the robot 120. The robot 120 in this embodiment comprises a robot drive unit 16 and a robot arm 122. The drive unit 16 is coupled to a controller 19 which may comprise, for example, at least one processor 21 and at least one memory 23 comprising computer code 25 for controlling the drive 16 and receiving sensor signals from sensors in the drive 16 as well as other sensors and inputs (not shown). The robot arm 122 may feature two linkages, i.e., a left linkage and a right linkage.

The left linkage, in this example embodiment, comprises an upper arm 124*a*, the left forearm 66 and the left wrist 68 with the left end-effector A 70. Similarly, the right linkage, in this example embodiment, comprises the upper arm 124*b*, the right forearm 76 and the right wrist 78 with the right end-effector B 80. In this example embodiment, the upper arms 124*a*, 124*b* of the left and right linkages are rigidly connected together, and can be viewed as a single shared link 124.

Figure 19:
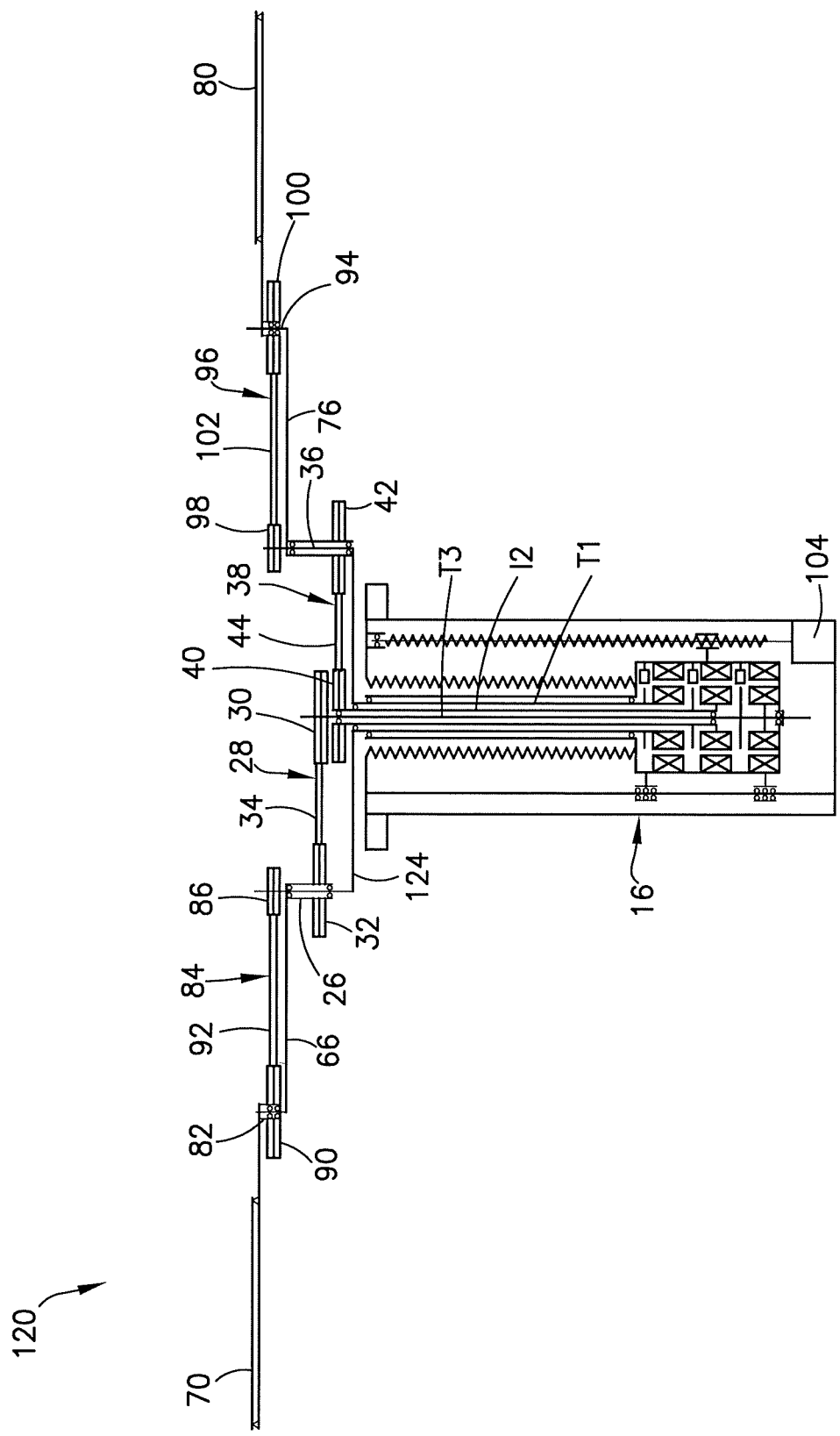
FIG. 19 is a diagram illustrating drive and transmission connections in the robot shown in FIGS. 18A-18B.

An example internal arrangement of the robot 120 is depicted diagrammatically in FIG. 19. The robot arm 122 may be driven by a robot drive unit 16 with a three-axis spindle with three coaxial shafts, e.g., an outer T1 shaft, a T2 shaft and an inner T3 shaft.

The upper arm 124 of the robot arm 122 may be attached directly to the T1 shaft. The left forearm 66 may be coupled to the upper arm 124 via a rotary joint (left elbow joint) 26, and actuated by the T2 shaft using a belt arrangement 28. The belt arrangement 28 may comprise a left shoulder pulley 30, which may be attached to the T2 shaft, a left elbow pulley 32, which may be attached to the left forearm 66, and a band, belt or cable 34, which may transmit motion between the two pulleys 30, 32.

The left wrist 68 with the left end-effector A 70 may be coupled to the left forearm 66 via a rotary joint (left wrist joint) 82, and rotationally constrained by another belt arrangement 84. The belt arrangement 84 may comprise a second left elbow pulley 86, which may be attached to the upper arm 124, a left wrist pulley 90, which may be attached to the left wrist 68, and a band, belt or cable 92, which may transmit motion between the two pulleys 86, 90. The belt arrangement 84 may feature a variable transmission ratio. As an example, the variable transmission ratio may be selected so that the orientation of the left wrist changes in a predefined manner as a function of the relative angle of the upper arm and the left forearm. However, any other suitable arrangement may be used.

The right linkage may be conceptually viewed as a mirror image of the left linkage. The right forearm 76 may be coupled to the upper arm 124 via a rotary joint (right elbow joint) 36, and actuated by the T3 shaft using a belt arrangement 38. The belt arrangement 38 may comprise a right shoulder pulley 40, which may be attached to the T3 shaft, a right elbow pulley 42, which may be attached to the right forearm 76, and a band, belt or cable 44, which may transmit motion between the two pulleys 40, 42.

The right wrist 78 with the right end-effector B 80 may be coupled to the right forearm 76 via a rotary joint (right wrist joint) 94, and rotationally constrained by another belt arrangement 96. The belt arrangement 96 may comprise a second right elbow pulley 98, which may be attached to the upper arm 76, a right wrist pulley 100, which may be attached to the right wrist 78, and a band, belt or cable 102, which may transmit motion between the two pulleys 98, 100. The belt arrangement 96 may feature a variable transmission ratio. As an example, the variable transmission ratio may be selected so that the orientation of the right wrist 78 changes in a predefined manner as a function of the relative angle of the right upper arm 124 and the right forearm 76. However, any other suitable arrangement may be used.

As an example, the variable-transmission belt arrangements 28, 38, 84, 96 may be conveniently designed so that, as the arm extends from its retracted position to a station, the orientation of the end-effector changes in a suitable predefined manner in the initial portion of the extension motion and then follows the radial path to the station in the final portion of the extension motion. More specifically, as an example, the variable-transmission belt arrangements may be designed so that, as the arm extends from its retracted position to a station, the orientation of the end-effector remains substantially parallel with the radial path to the station until the forearm rotates directly above the upper arm and then follows the radial path to the station.

The T1, T2 and T3 shafts of the robot drive unit may be rotated so that the left end-effector A 70 and right end-effector B 80 can access various stations, as illustrated diagrammatically in FIGS. 20-21, which show diagrams of the robot 120 in an example semiconductor wafer processing system 6.

In order for the entire robot arm 122 to rotate, all drive shafts, i.e., T1, T2 and T3, need to move in the desired direction of rotation of the arm 122 by the same amount with respect to a fixed reference frame. This is depicted diagrammatically in FIGS. 20A-20B. In this particular example, the entire robot arm 122 rotates in the clockwise direction by 90 degrees.

Figure 21C:
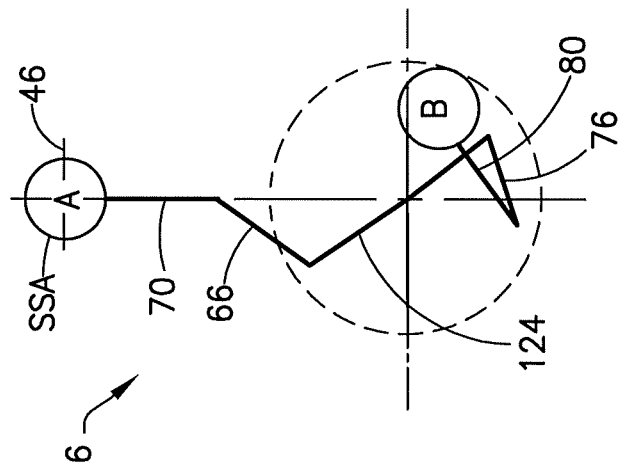
FIGS. 21A-21E are diagrams illustrating example movement of the robot of FIGS. 18-19 in the substrate processing system shown in FIGS. 20A-20B.
Figure 21B:
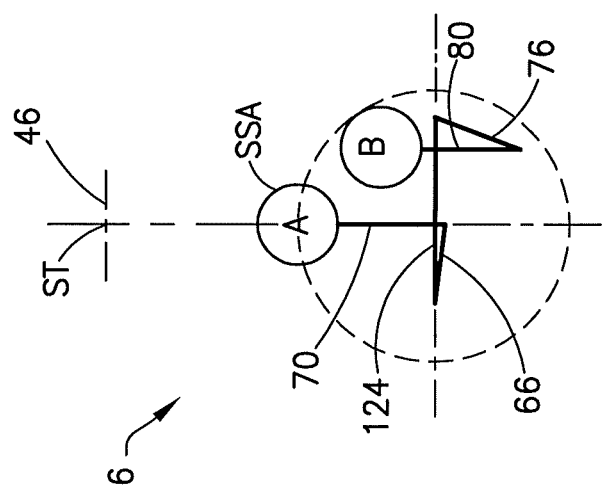
Figure 21A:
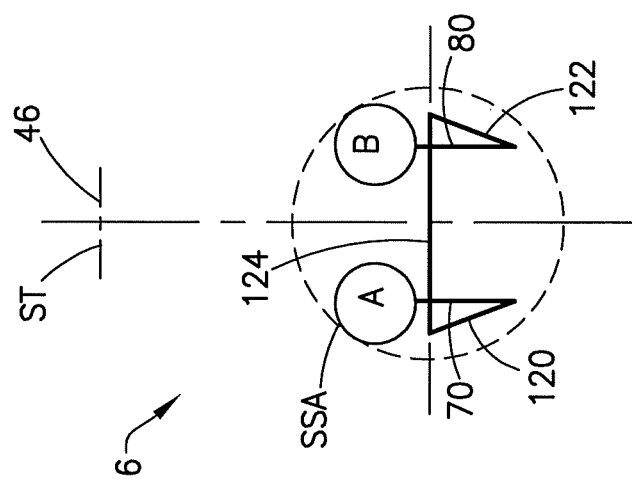
Figure 21E:
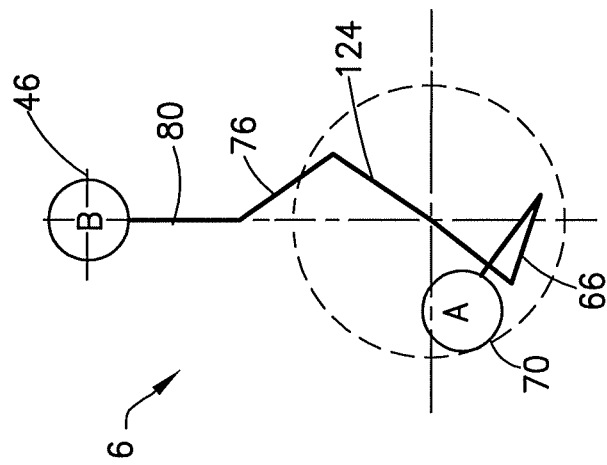

In order for the left end-effector A 70 to extend from the common retracted position of FIG. 21A to the partially extended position of FIG. 21B, shaft T2 may rotate in the counterclockwise direction while shaft T1 may be held stationary. The variable-transmission belt arrangements may be conveniently designed so that the orientation of the left end-effector 80 may remain parallel with the starting orientation and/or the radial path to the station ST 46 during the move to the partially extended position of FIG. 21B. In order to complete the extension from the partially extended position of FIG. 21B to the station ST 46 along a predefined path, such as a straight-line radial path for example, as depicted diagrammatically in the example of FIG. 21C, shafts T2 may rotate in the counterclockwise direction while shaft T1 may rotate in the clockwise direction. As illustrated in the figures, the right end-effector B 80 may rotate as the left end-effector A 70 extends to the station ST 46. The left end-effector A 70 may be retracted by rotating the T1 and T2 shafts backward in a similar manner.

Figure 21D:
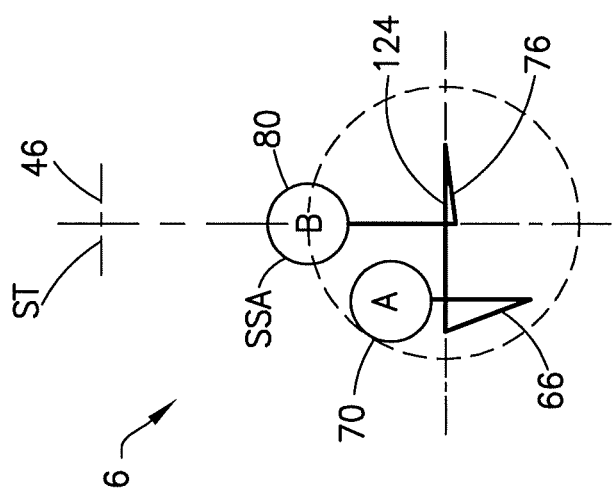

In order for the right end-effector B 80 to extend from the common retracted position of FIG. 21A to the partially extended position of FIG. 21D, shaft T3 may rotate in the clockwise direction while shaft T1 may be held stationary. The variable-transmission belt arrangements may be conveniently designed so that the orientation of the right end-effector may remain parallel with the starting orientation and/or the radial path to the station ST 46 during the move to the partially extended position of FIG. 21D. In order to complete the extension from the partially extended position of FIG. 21D to the station ST 46 along a predefined path, such as a straight-line radial path for example, as depicted diagrammatically in the example of FIG. 21E, shafts T3 may rotate in the clockwise direction while shaft T1 may rotate in the counterclockwise direction. As illustrated in the figure, the left end-effector A 70 may rotate as the right end-effector B 80 extends to the station. The right end-effector B 80 may be retracted by rotating the T1 and T3 shafts backward in a similar manner.

The above operations may be utilized to pick/place a wafer from/to a station. A sequence of a pick operation with one end-effector followed by a place operation with the other end-effector may be used to quickly exchange a wafer at the station (rapid exchange operation). As an example, the left end-effector A 70 may be extended to the station, pick a wafer, and retract. The right end-effector B 80, which may carry another wafer, may then extend to the same station, place the wafer, and retract.

Figure 23:
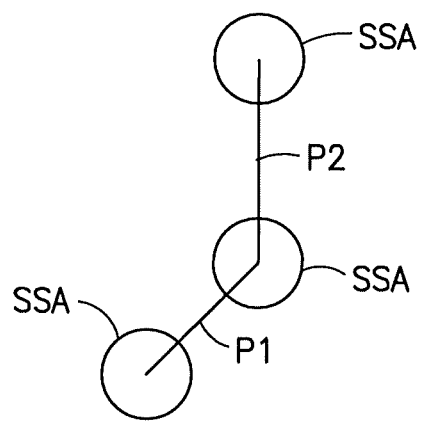
FIG. 23 is a diagram illustrating two different paths of movement of the first end effector shown FIGS. 21A-21C.

The extension motion from the retracted position of FIG. 21A to the extended position of FIG. 21C illustrates two different types of paths P1 and P2 and motions which the substrate supporting area SSA of the first end effector 70 travels between the retracted first position shown in FIG. 21A to the extended position inside the substrate processing module 46 shown in FIG. 21C. Referring also to FIG. 23, the first path P1 is straight, but may be curved as in the example shown in FIGS. 17A-17D. The second path P2 is straight. In the first path P1 from FIG. 21A to FIG. 21B the SSA is moved from the retracted first position shown in FIG. 21A to the start of the second path P2 shown in FIG. 21B. From the start of the second path P2 shown in FIG. 21B, the SSA is then moved forward into the station 46 with the end effector 70 being straight during the travel along the second path and the SSA traveling along the straight line of the second path P2.

As depicted diagrammatically in FIG. 19, the robot drive unit 16 may include a vertical lift mechanism 104 to control the vertical elevation of the robot arm 122, which may be used to access stations ST at different elevations, compensate for the vertical distance between the end-effectors of the robot arm if the end-effectors are not coplanar, and facilitate material pick/place operations.

Although the illustrations of the example embodiment show the robot 120 in the retracted position with the left and right end-effectors 70, 80 oriented in a substantially parallel manner, any suitable orientation of the end-effectors may be used. Similarly, although the example embodiment shows the left forearm 66 of the robot driven by the T2 shaft and the right forearm 76 of the robot driven by the T3 shaft, any suitable driving schemes and transmission arrangements may be used. Furthermore, while straight lines are used to represent the example embodiment in the figures, the upper arms, forearms and end-effectors may feature any suitable shapes, for instance, to avoid interference with obstacles in the workspace of the robot.

Figure 22A:
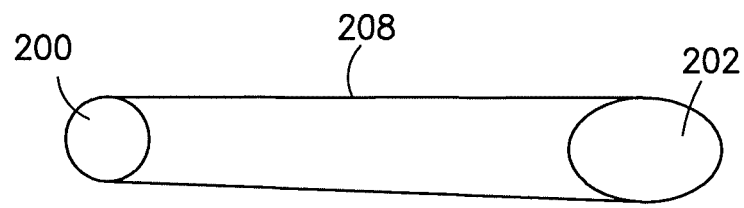
FIGS. 22A-22B illustrate some examples of circular and non-circular pulleys in belt/band transmissions.
Figure 22B:
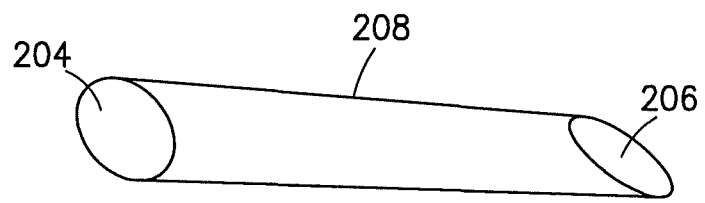

As noted above, any of the belt arrangement may feature a constant or variable transmission ratio, for example, implemented through the use of circular and/or non-circular pulleys. FIGS. 22A-22B show some examples of a circular pulley 200 and non-circular pulleys 202, 204, 206 connected by bands/belts 208. These are merely examples and should not be considered as limiting. Other suitably sized and shaped non-circular pulleys could be provided.

Although the examples described above include robot drives having only three coaxial drive shafts and only three motors for rotating those coaxial drive shafts, in alternate examples more than three drive shafts and more than three motors could be provided.

An example embodiment may be provided in an apparatus comprising a controller comprising a processor and a memory comprising computer code; a robot drive coupled to the controller, where the controller is configured to control actuation of the robot drive; a robot arm connected to the robot drive, where the robot arm comprises links including an upper arm, a first forearm connected to a first end of the upper arm, a second forearm connected to a second opposite end of the upper arm, a first end effector connected to the first forearm and a second end effector connected to the second forearm; and a transmission connecting the robot drive to the first and second forearms and the first and second end effectors, where the transmission is configured to rotate the first and second forearms relative to the upper arm and rotate the first and second end effectors on their respective first and second forearms, where the upper arm is substantially rigid such that movement of the upper arm by the robot drive moves both the first and second forearms in opposite directions, where the controller and the transmission are configured to coordinate movement and rotation of the links relative to one another to move the end effectors into and out of a station comprising: moving the first forearm relative to the upper arm, while the upper arm remains substantially stationary, to move the first end effector into an entrance path of the station, and subsequently rotating the upper arm and the first forearm to move the first end effector along the entrance path in a substantially straight line into the station.

The robot drive may comprise a plurality of motors and a plurality of coaxial drive shafts, where a center of the upper arm is mounted to a first one of the drive shafts. The plurality of coaxial drive shafts may comprise only three coaxial drive shafts and the plurality of motors may comprise only three motors for axially rotating the three coaxial drive shafts. The upper arm may have an effective length between the center of the upper arm and the first drive shaft which is substantially equal to an effective length of the first forearm between the upper arm and the first end effector. The transmission may comprise a first drive belt arrangement connecting a second one of the drive shafts to the first forearm and a second drive belt arrangement connecting the first forearm to the first end effector, where the second drive belt arrangement may comprise a variable transmission belt drive with at least one non-circular pulley. The transmission may comprise a third drive belt arrangement connecting a third one of the drive shafts to the second forearm and a fourth drive belt arrangement connecting the second forearm to the second end effector, where the fourth drive belt arrangement may comprise a variable transmission belt drive with at least one non-circular pulley. The transmission may comprise a first mechanical connection of the first end effector with the first forearm and a second mechanical connection of the second end effector with the second forearm which each may comprise a band drive having at least one non-circular pulley, and each of the first and second mechanical connections, including their at least one non-circular pulley, are configured to limit movement of the first and second end effectors on their respective first and second forearms such that the mechanical connections allow only straight movement of the first end effector relative to the drive when both the upper arm is rotated and the first forearm is rotated relative to the upper arm. The controller and the transmission may be configured to coordinate movement and rotation of the links relative to one another to provide a first translation motion of the first end effector in a lateral direction into an entrance path of a substrate processing module while the upper arm remains substantially stationary and a subsequent second translation motion of the first end effector, angled relative to the first translation motion, when both the first forearm and the upper arm are rotated to move the first end effector along the entrance path in the substantially straight line into the station.

An example method may comprise connecting a controller to a robot drive; connecting an upper arm to a first drive shaft of the robot drive; connecting a first forearm to an end of an upper arm; connecting a second forearm to an opposite end of the upper arm; connecting a first end effector to the first forearm; connecting a second end effector to the second forearm; connecting a first transmission belt arrangement between a second drive shaft of the robot drive and the first forearm; connecting a second transmission belt arrangement between the first forearm and the first end effector, where the second transmission belt arrangement is configured to rotate the first end effector relative to the first forearm when the first forearm is rotated relative to the upper arm, where the controller and the transmission belt arrangements are configured to coordinate movement of the upper arm and the first forearm on the upper arm relative to each another to move the first end effector into a station comprising: a first path comprising moving the first forearm relative to the upper arm, while the upper arm remains substantially stationary, to move the first end effector into a starting location of a second entrance path for the station, and the second entrance path comprising subsequently rotating the upper arm and the first forearm on the upper arm to move the first end effector along the second entrance path in a substantially straight line into the station.

The robot drive may comprise a plurality of motors and a plurality of coaxial drive shafts, where a center of the upper arm is mounted to a first one of the drive shafts, where rotating the upper arm may comprise rotating the upper arm about the center of the upper arm. The plurality of coaxial drive shafts may comprise only three coaxial drive shafts and the plurality of motors may comprise only three motors which axially rotate the three coaxial drive shafts. The upper arm may have an effective length between the center of the upper arm and the first drive shaft which is substantially equal to an effective length of the first forearm between the upper arm and the first end effector. The connecting of the first transmission belt arrangement may comprise connecting the second drive shaft to the first forearm by a first belt and a first set of pulleys, where the connecting of the second transmission belt arrangement may comprise connecting the first forearm to the first end effector by a second belt and a second set of pulleys, and where the second set of pulleys may comprise at least one non-circular pulley to provide a variable transmission belt drive. The method may further comprise connecting a third drive shaft of the robot drive to the second forearm by a third belt and a third set of pulleys, connecting the second forearm to the second end effector by a fourth belt and a fourth set of pulleys, and where the fourth set of pulleys may comprise at least one non-circular pulley to provide a variable transmission belt drive. The second transmission belt arrangement may comprise a mechanical connection of the first end effector with the first forearm which comprises a band drive having at least one non-circular pulley, and the mechanical connection, including the at least one non-circular pulley, may limit movement of the first end effectors on the first forearm such that the mechanical connection allows only straight movement of the first end effector relative to the drive when both the upper arm is rotated and the first forearm is rotated relative to the upper arm.

An example method may comprise moving a first end effector along a first path from a first location to a second location, where the second location is a start of a subsequent second substantially straight entrance path into a substrate processing module, where the first end effector is connected to an end of a first forearm of a robot arm, where the first end effector is moved along the first path by rotating the first forearm on an upper arm of the robot arm by a robot drive while the upper arm remains substantially stationary, and rotating the first end effector relative to the first forearm as the first forearm is rotated on the upper arm, where the robot arm comprises a transmission belt arrangement connected between the first end effector and the first forearm to automatically mechanically rotate the first end effector relative to the first forearm as the first forearm is rotated on the upper arm; and moving the first end effector from the second location into the substrate processing module along the second substantially straight entrance path, where the second substantially straight entrance path is maintained by rotating the upper arm by the robot drive to move the first forearm towards the substrate processing module and simultaneously rotating the first forearm on the upper arm while the transmission belt arrangement automatically mechanically rotates the first end effector relative to the first forearm, as the first forearm is rotated on the upper arm, to maintain the first end effector in a substantially straight line into the substrate processing module.

The robot drive may comprise a plurality of motors and a plurality of coaxial drive shafts, where a center of the upper arm is mounted to a first one of the drive shafts, where rotating the upper arm may comprise rotating the upper arm about the center of the upper arm. The plurality of coaxial drive shafts may comprise only three coaxial drive shafts and the plurality of motors comprises only three motors which axially rotate the three coaxial drive shafts. The upper arm may have an effective length between the center of the upper arm and the first drive shaft which is substantially equal to an effective length of the first forearm between the upper arm and the first end effector. The transmission belt arrangement may comprise a first belt and a first set of pulleys, and where the first set of pulleys may comprise at least one non-circular pulley to provide a variable transmission belt drive when the first end effector is rotated on first forearm.

An example embodiment may be provided in an apparatus comprising means for moving a first end effector along a first path from a first location to a second location, where the second location is a start of a subsequent second substantially straight entrance path into a substrate processing module, where the first end effector is connected to an end of a first forearm of a robot arm, where the first end effector is moved along the first path by rotating the first forearm on an upper arm of the robot arm by a robot drive while the upper arm remains substantially stationary, and rotating the first end effector relative to the first forearm as the first forearm is rotated on the upper arm, where the robot arm comprises a transmission belt arrangement connected between the first end effector and the first forearm to automatically mechanically rotate the first end effector relative to the first forearm as the first forearm is rotated on the upper arm; and means for moving the first end effector from the second location into the substrate processing module along the second substantially straight entrance path, where the second substantially straight entrance path is maintained by rotating the upper arm by the robot drive to move the first forearm towards the substrate processing module and simultaneously rotating the first forearm on the upper arm while the transmission belt arrangement automatically mechanically rotates the first end effector relative to the first forearm, as the first forearm is rotated on the upper arm, to maintain the first end effector in a substantially straight line into the substrate processing module.

It should be understood that the foregoing description is only illustrative. Various alternatives and modifications can be devised by those skilled in the art. For example, features recited in the various dependent claims could be combined with each other in any suitable combination(s). In addition, features from different embodiments described above could be selectively combined into a new embodiment. Accordingly, the description is intended to embrace all such alternatives, modifications and variances which fall within the scope of the appended claims.

What is claimed is:

1. An apparatus comprising:
a robot arm configured to be connected to a robot drive, where the robot arm comprises links including an upper arm, a first forearm connected to a first end of the upper arm, a second forearm connected to a second opposite end of the upper arm, a first end effector stationarily connected to a distal end of the first forearm and a second end effector stationarily connected to a distal end of the second forearm; and
a transmission connected to the first forearm and the second forearms, where the transmission is configured to connect the robot drive to the first forearm and the second forearms, where the transmission is configured to separately rotate the first forearm relative to the upper arm and the second forearm relative to the upper arm,
where the upper arm is substantially rigid such that movement of the upper arm by the robot drive moves both the first and second forearms, where the upper arm comprises a general V shape with a base of the V shape configured to be connected to the robot drive, where the general V shape of the upper arm comprises a first arm section extending from the base and a second arm section extending from the base, where the first and second arm sections of the upper arm extend from the base at an acute angle relative to each other, where the first end of the upper arm is an end of the first arm section and the second end of the upper arm is an end of the second arm section.

2. The apparatus as in claim 1 further comprising:
a controller comprising a processor and a memory comprising computer code, where the robot drive is coupled to the controller, where the controller is configured to control actuation of the robot drive, where the controller and the transmission are configured to coordinate movement and rotation of the links relative to one another to move the end effectors into and out of one or more stations comprising:
rotating the upper arm about the robot drive, where both the first and second forearms are rotated about the robot drive at a same time, and
rotating the first forearm relative to the upper arm while the upper arm is rotated about the robot drive to move the first end effector into an entrance path of one of the one or more stations, where the controller causes the second forearm to not be moved relative to the upper arm while the upper arm is rotated about the robot drive such that the second forearm is not rotated relative to the upper arm as the first forearm is moved into the entrance path of the station.

3. The apparatus as in claim 2 where the robot drive comprises a plurality of motors and a plurality of coaxial drive shafts, where the base is a center of the upper arm mounted to a first one of the drive shafts.

4. The apparatus as in claim 3 where the plurality of coaxial drive shafts comprises only three coaxial drive shafts and the plurality of motors comprises only three motors for axially rotating the three coaxial drive shafts.

5. The apparatus as in claim 3 where the upper arm has an effective length between the base of the general V shape and the first forearm which is substantially equal to an effective length of the first forearm between the upper arm and the first end effector.

6. The apparatus as in claim 3 where the transmission comprises a first drive belt arrangement connecting a second one of the drive shafts to the first forearm and a second drive belt arrangement connecting a third one of the drive shafts to the second forearm.

7. The apparatus as in claim 1 where the transmission comprises a band drive having at least one non-circular pulley.

8. The apparatus as in claim 1 where the controller and the transmission are configured to coordinate movement and rotation of the links relative to one another to provide a straight line motion path of a substrate holding area on the first end effector in a direction into the entrance path of the station.

9. A method comprising:
connecting an upper arm to a first drive shaft of a robot drive;
connecting a first forearm to a first end of the upper arm;
connecting a second forearm to an opposite second end of the upper arm;
connecting a first end effector to the first forearm at a fixed connection;
connecting a second end effector to the second forearm at a fixed connection;
connecting a first transmission belt arrangement between a second drive shaft of the robot drive and the first forearm;
connecting a second transmission belt arrangement between a third drive shaft of the robot drive and the second forearm;
where the upper arm is substantially rigid such that movement of the upper arm by the robot drive moves both the first and second forearms, where the upper arm comprises a general V shape with a base of the V shape being connected to the robot drive, where the general V shape of the upper arm comprises a first arm section and a second arm section extending from the base at an acute angle relative to each other, where the first end of the upper arm is an end of the first arm section and the second end of the upper arm is an end of the second arm section.

10. The method of claim 9 further comprising:
connecting a controller to the robot drive, where the controller and the transmission belt arrangements are configured to coordinate movement of the upper arm and the first forearm on the upper arm relative to each another to move the first end effector into a station comprising:
rotating the upper arm about the robot drive, where both the first and second forearms are rotated about the robot drive, and
moving the first forearm relative to the upper arm while the upper arm is rotated about the robot drive to move the first end effector into an entrance path of the station, where the controller causes the second forearm to not be moved relative to the upper arm while the upper arm is rotated about the robot drive such that the second forearm is not rotated relative to the upper arm as the first forearm is moved into the entrance path of the station.

11. The method of claim 9 where the robot drive comprises a plurality of motors and a plurality of coaxial drive shafts, where the base of the upper arm is mounted to a first one of the drive shafts.

12. The method of claim 11 where the plurality of coaxial drive shafts comprises only three coaxial drive shafts and the plurality of motors comprises only three motors for axially rotating the three coaxial drive shafts.

13. The method of claim 11 where the upper arm has an effective length between the base of the upper arm and the first forearm which is substantially equal to an effective length of the first forearm between the upper arm and the first end effector.

14. The method of claim 11 where the first transmission belt arrangement comprises a band drive having at least one non-circular pulley.

15. The method of claim 11 where the controller and the transmission belt arrangements are configured to coordinate movement and rotation of the links relative to one another to provide a straight line motion path of a substrate holding area on the first end effector in a direction into the entrance path of the station.

16. A method comprising:
moving an upper arm of a robot arm by a robot drive, where the upper arm is rotated by the robot arm, where the robot arm comprises links including the upper arm, a first forearm connected to a first end of the upper arm, a second forearm connected to a second opposite end of the upper arm, a first end effector stationarily connected to a distal end of the first forearm and a second end effector stationarily connected to a distal end of the second forearm, where the upper arm is substantially rigid such that movement of the upper arm by the robot drive moves both the first and second forearms, where the upper arm comprises a general V shape with a base of the general V shape connected to the robot drive, where the general V shape of the upper arm comprises a first arm section and a second arm section extending from the base at an acute angle relative to each other, where the first end of the upper arm is an end of the first arm section and the second end of the upper arm is an end of the second arm section;
rotating the first forearm on the upper arm, while the upper arm is rotated about the robot drive, to move the first end effector into an entrance path of a station, and where the second forearm is prevented from being moved relative to the upper arm while the first forearm is rotated about the upper arm such that the second forearm is not rotated relative to the upper arm as the first forearm is moved into the entrance path of the station.

* * * * *